United States Patent
Hu et al.

(10) Patent No.: US 8,207,779 B2
(45) Date of Patent: Jun. 26, 2012

(54) CONTROL CIRCUITS AND METHODS FOR CONTROLLING SWITCHING DEVICES

(75) Inventors: Zong Bo Hu, Shenzhen (CN); Ying Qu, Shenzhen (CN); Kevin Donald Wildash, Shenzhen (CN); Wai Kin Chan, Shenzhen (CN); Wing Ling Cheng, Taipo (HK)

(73) Assignee: Astec International Limited, Kwun Tong, Kowloon (HK)

( * ) Notice: Subject to any disclaimer, the term of this patent is extended or adjusted under 35 U.S.C. 154(b) by 95 days.

(21) Appl. No.: 12/121,988

(22) Filed: May 16, 2008

(65) Prior Publication Data

US 2009/0284302 A1 Nov. 19, 2009

(51) Int. Cl.
*H03K 17/16* (2006.01)
(52) U.S. Cl. ........ 327/389; 327/108; 327/374; 327/387; 327/403; 327/427
(58) Field of Classification Search .......... 327/108–112, 327/374–477
See application file for complete search history.

(56) References Cited

U.S. PATENT DOCUMENTS

| | | | |
|---|---|---|---|
| 3,828,206 A * | 8/1974 | Zuk | 327/489 |
| 4,969,027 A | 11/1990 | Baliga et al. | |
| 5,831,471 A | 11/1998 | Nakajima et al. | |
| 6,060,943 A | 5/2000 | Jansen | |
| 6,225,857 B1 | 5/2001 | Brokaw | |
| 6,301,133 B1 | 10/2001 | Cuadra et al. | |
| 6,469,564 B1 * | 10/2002 | Jansen | 327/365 |
| 6,522,190 B1 | 2/2003 | Malik et al. | |
| 6,594,163 B2 | 7/2003 | Tsai | |
| 6,919,758 B1 | 7/2005 | Preslar et al. | |
| 7,038,433 B2 | 5/2006 | Fan et al. | |
| 7,190,207 B2 | 3/2007 | Chen | |
| 7,283,845 B2 * | 10/2007 | De Bast | 455/566 |
| 7,456,620 B2 | 11/2008 | Maksimovic et al. | |
| 7,667,525 B2 | 2/2010 | Grimone, III | |
| 7,675,758 B2 | 3/2010 | Artusi et al. | |
| 2002/0039034 A1 | 4/2002 | Kohda | |

(Continued)

FOREIGN PATENT DOCUMENTS

| | | |
|---|---|---|
| DE | 3217791 | 11/1983 |
| GB | 2293290 | 3/1996 |
| WO | 99/53618 | 10/1999 |

OTHER PUBLICATIONS

"Influence of the doping profile on the collector junction breakdown voltages in planar n-p-n transistors," N.A. Samoilov, A.N. Frolov and S.V. Shutov; Technical Physics, vol. 43, No. 10; Oct. 1998; pp. 1262-1263.

(Continued)

*Primary Examiner* — Lincoln Donovan
*Assistant Examiner* — Shikha Goyal
(74) *Attorney, Agent, or Firm* — Harness, Dickey & Pierce, P.L.C.

(57) ABSTRACT

A control circuit for controlling a switching device having a first terminal, a second terminal, and a control terminal is disclosed. The control circuit includes a first diode for coupling to the first terminal of the switching device, a second diode for coupling to the second terminal of the switching device, a first transistor for coupling to the control terminal of the switching device, and a second transistor coupled to the second diode. The first transistor is coupled to the first diode. The control circuit is configured to allow current flow in only one direction between the first and second terminals of the switching device.

30 Claims, 40 Drawing Sheets

U.S. PATENT DOCUMENTS

| | | | |
|---|---|---|---|
| 2005/0253642 | A1 | 11/2005 | Chen |
| 2006/0226887 | A1* | 10/2006 | Grimone, III ............... 327/403 |
| 2008/0030263 | A1 | 2/2008 | Frederick et al. |
| 2009/0285001 | A1* | 11/2009 | Hu et al. ............... 363/126 |

OTHER PUBLICATIONS

"Equivalent doping profile transformation: A semi-empirical analytical method for predicting breakdown characteristics of an approximate single-diffused parallel-plane junction," J. He, X. Shang and Y. Wang; IEEE Transactions on Electron Devices, vol. 48, No. 12; Dec. 2001; pp. 2763-2768.

"Regulating Pulse Width Modulator," datasheet and application notes for 1524, SG2524/SG3524 devices, LinFinity Microelectronics; Mar. 18, 2005; pp. 1-6.

Philips "BC847BS, NPN General Purpose Double Transistor", Philips Semiconductors Apr. 28, 1999; 9 pgs.

Philips "BAV23, General Purpose Double Diode", Philips Semiconductors Sep. 17, 1996; 8 pgs.

* cited by examiner

CONTROL CIRCUITS AND METHODS FOR CONTROLLING SWITCHING DEVICES

FIELD

The present disclosure relates to control circuits and methods for controlling switching devices.

BACKGROUND

A variety of controllers are known for controlling switching devices, including field effect transistors (FETs). For example, control circuits are known for ORing FETs, polarity protection FETs, and synchronous rectifiers incorporated into various applications, such as power supplies.

In particular, three controllers for MOSFETs are shown in FIGS. 1-3. As shown in FIG. 1, a controller 100 is connected to control a MOSFET Q having a source terminal, a gate terminal, and a drain terminal. The controller 100 includes a bipolar junction transistor Q1 connected to the source terminal and the gate terminal of the MOSFET Q and a diode D1 connected to the drain terminal of the MOSFET Q. The control circuit 100 also includes two resistors R1, R2. As shown in FIG. 2, a controller 200 is connected to a MOSFET Q having a source terminal, a gate terminal, and a drain terminal. The controller 200 includes two bipolar junction transistors Q1, Q2 and resistors R1, R2. The transistor Q1 is connected to the source terminal of the MOSFET Q, and the transistor Q2 is connected to the drain terminal of the MOSFET Q. As shown in FIG. 3, a control circuit 300 is connected to control a MOSFET Q having a source terminal, a gate terminal, and a drain terminal. The control circuit 300 includes two bipolar junction transistors Q1, Q2. The transistor Q1 is connected to the source terminal of the MOSFET Q, and the transistor Q2 is connected to the drain terminal of the MOSFET Q. The orientation of the transistor Q2 in FIG. 3 is different than the orientation of the transistor Q2 in FIG. 2. The control circuit 300 also includes two resistors R1, R2. Each controller allows current to pass in one direction, while blocking current in a second direction.

While the control circuits discussed above are suitable for their intended purpose, the present inventors have understood a need for an improved control circuit for switching devices.

SUMMARY

According to one aspect of the present disclosure, a control circuit for controlling a switching device having a first terminal, a second terminal, and a control terminal is disclosed. The control circuit includes a first diode for coupling to the first terminal of the switching device, a second diode for coupling to the second terminal of the switching device, a first transistor for coupling to the control terminal of the switching device, and a second transistor coupled to the second diode. The first transistor is coupled to the first diode. The control circuit is configured to allow current flow in only one direction between the first and second terminals of the switching device.

According to another aspect of the present disclosure, a method of controlling a switching device having a first terminal, a second terminal and a control terminal is disclosed. The method includes operating the switching device substantially exclusively in its linear mode while allowing current flow in only one direction between the first terminal and the second terminal.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

Figure 5:
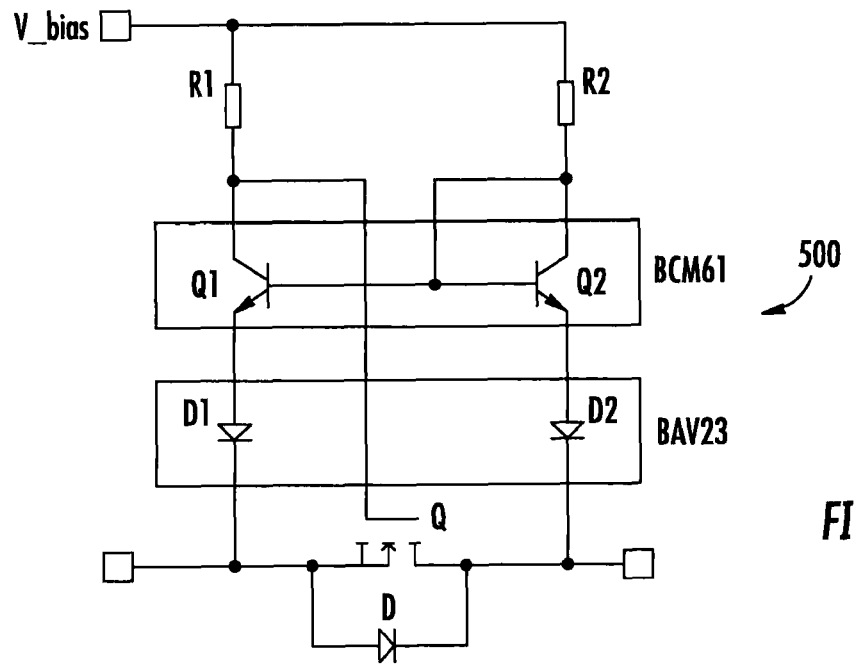
FIG. 5 illustrates a schematic view of a control circuit including a dual transistor package.
Figure 8A:
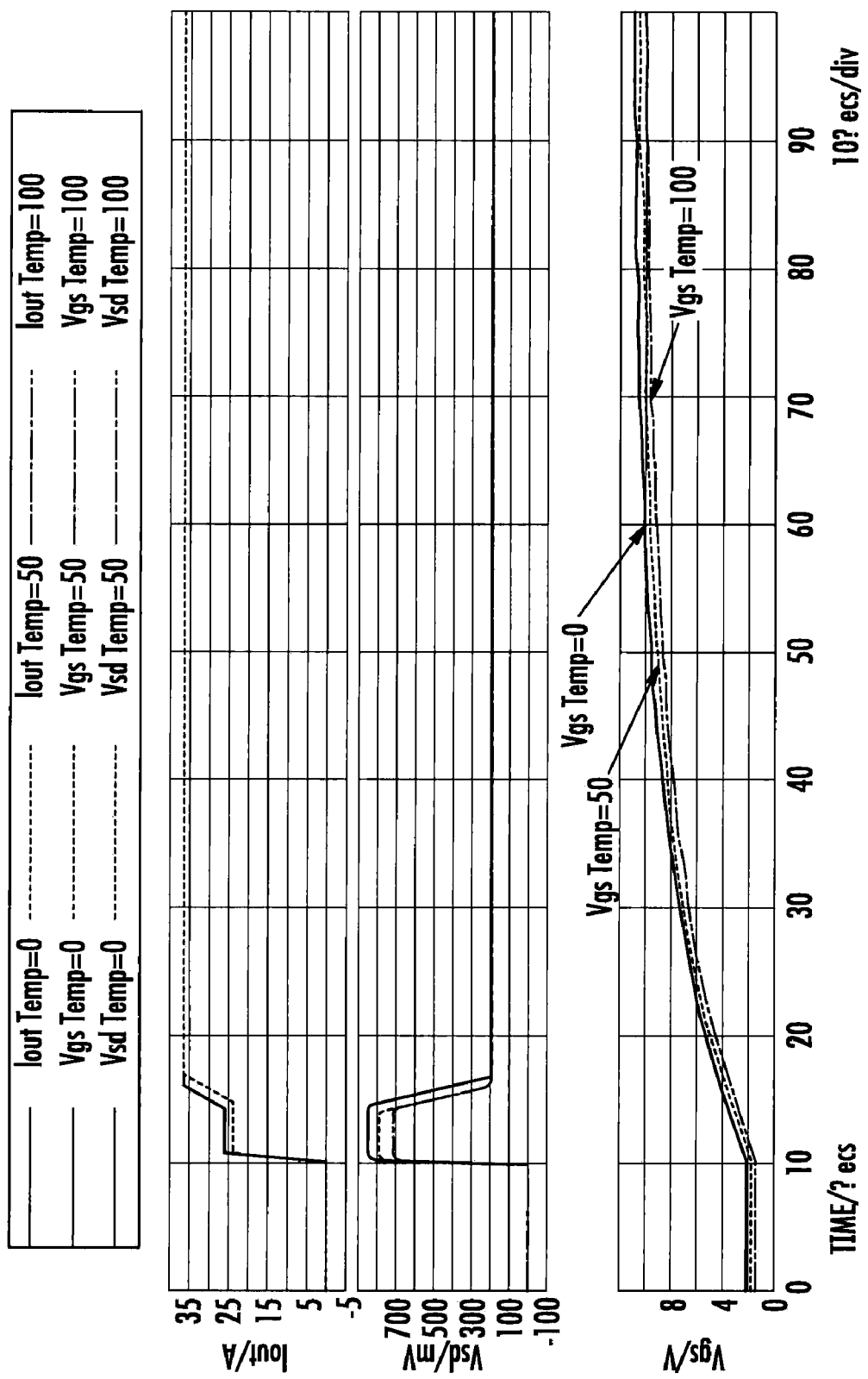
Figure 8B:
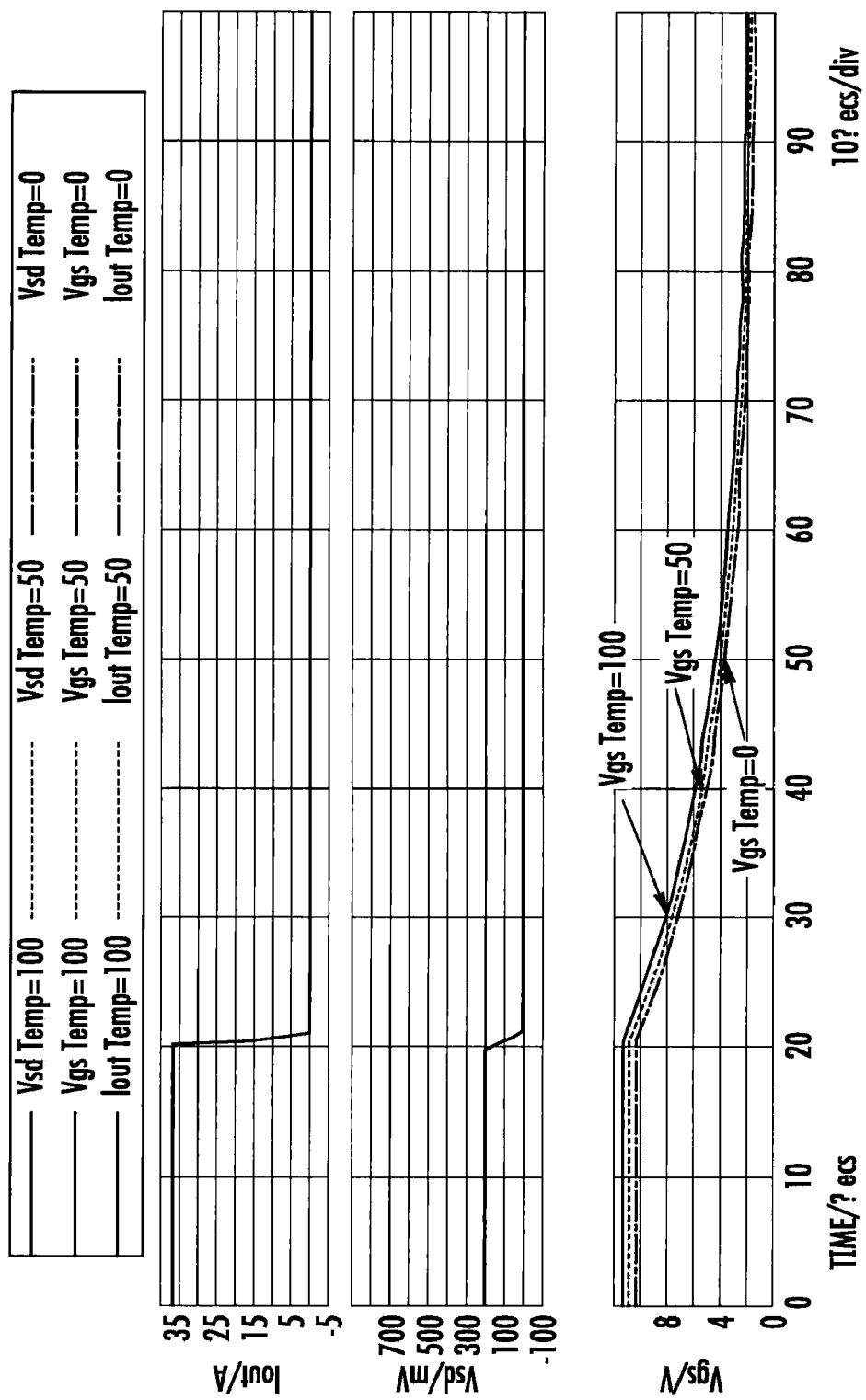

FIGS. 8A-B illustrate waveforms of turn ON and turn OFF switching times of the switching device of FIG. 5 at various temperatures.

Figure 9:
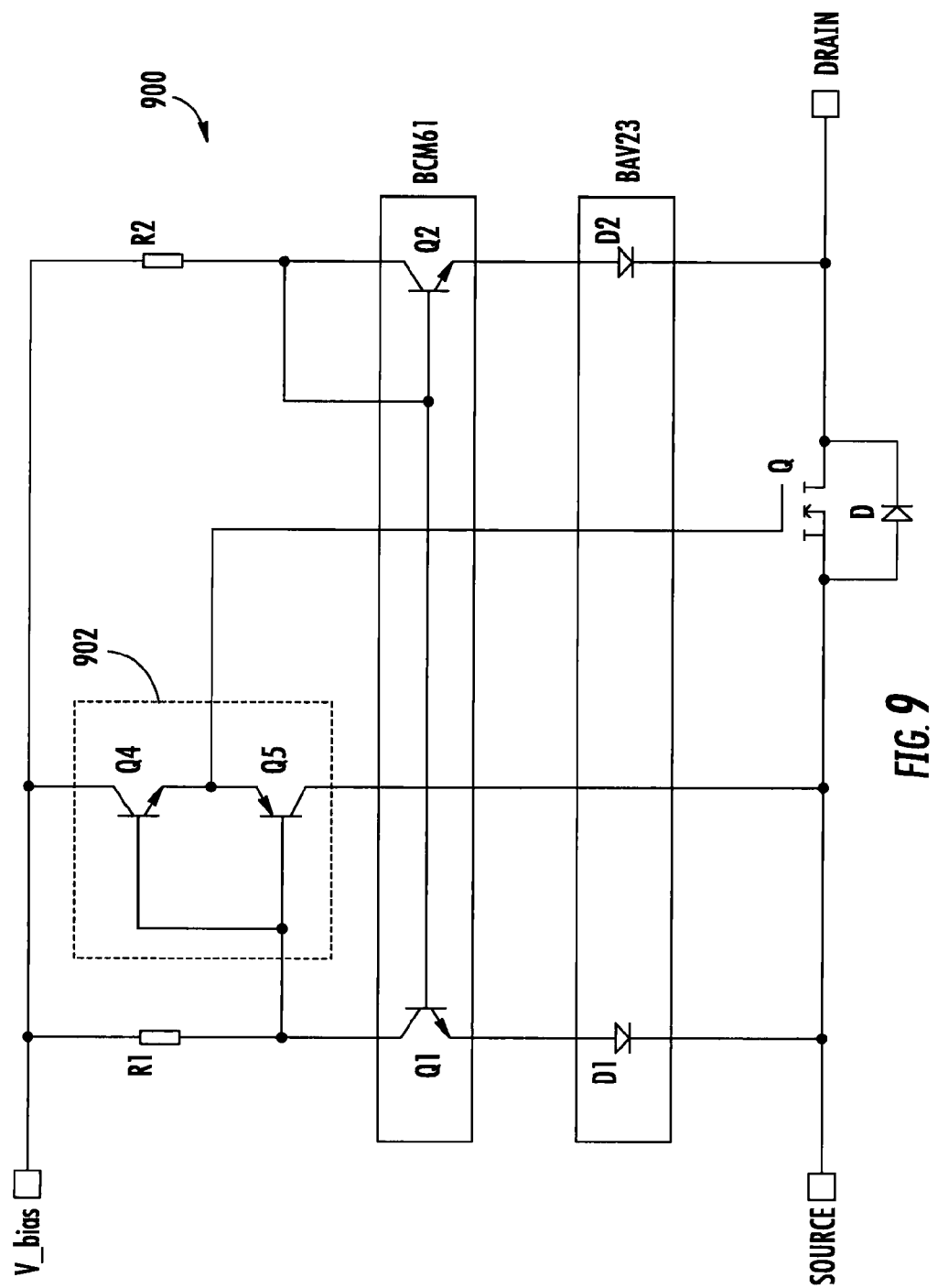

FIG. 9 illustrates a schematic view of a control circuit including a totem pole circuit.

Figure 10:
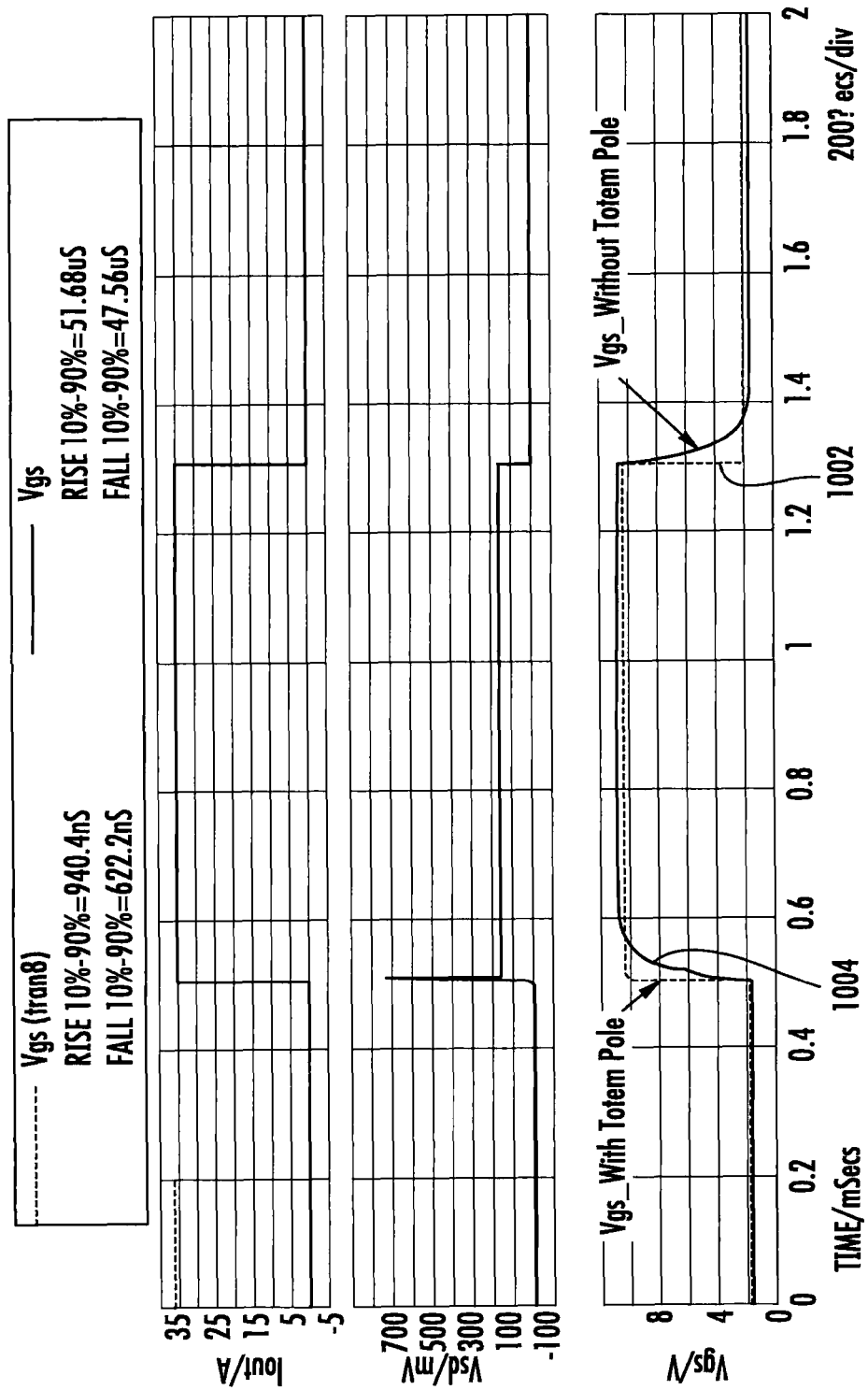

FIG. 10 illustrates waveforms of switching times of the switching device of FIG. 9 with and without the totem pole circuit.

Figure 11:
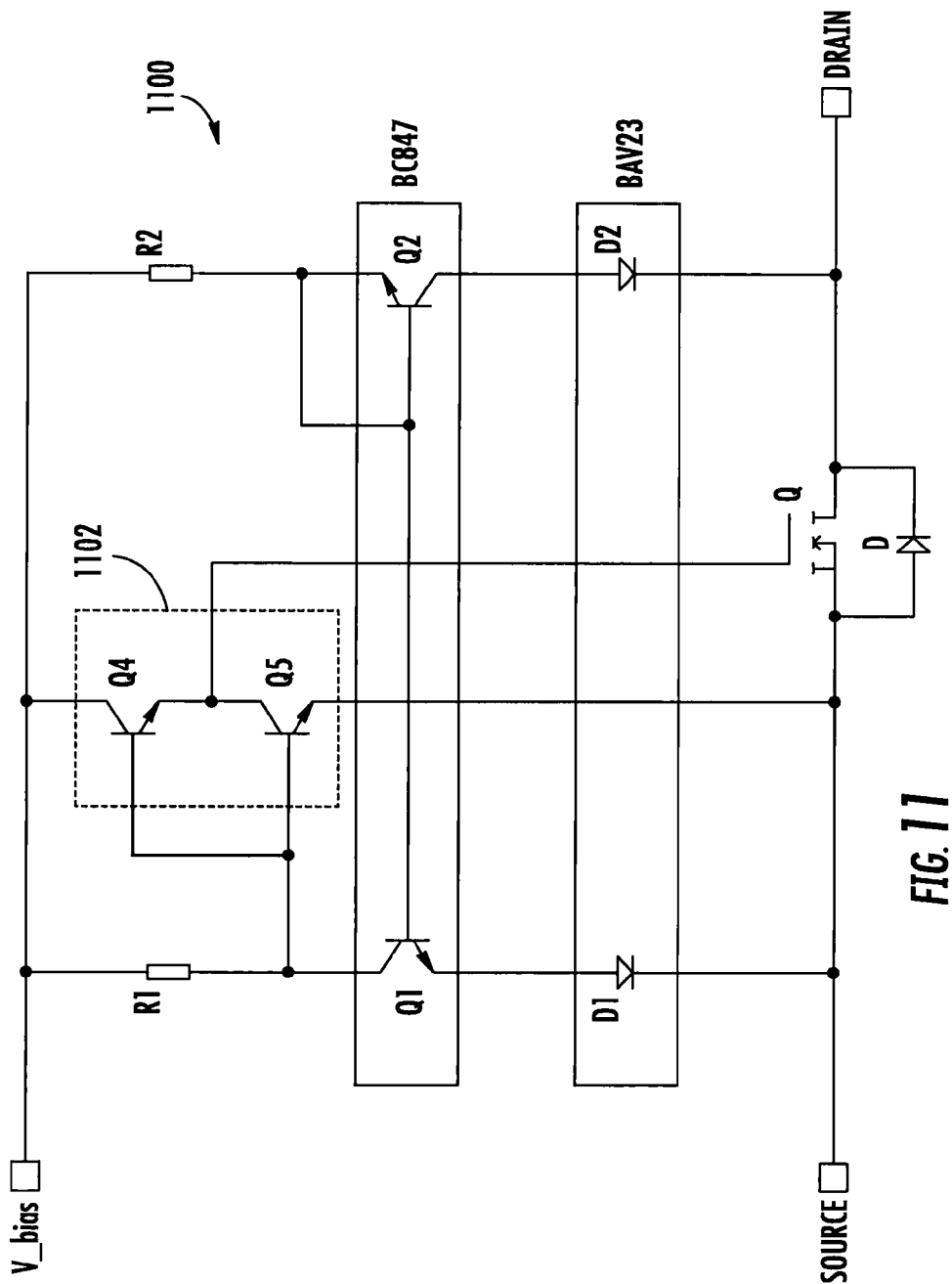

FIG. 11 illustrates a schematic view of a control circuit including unmatched transistors.

Figure 12:
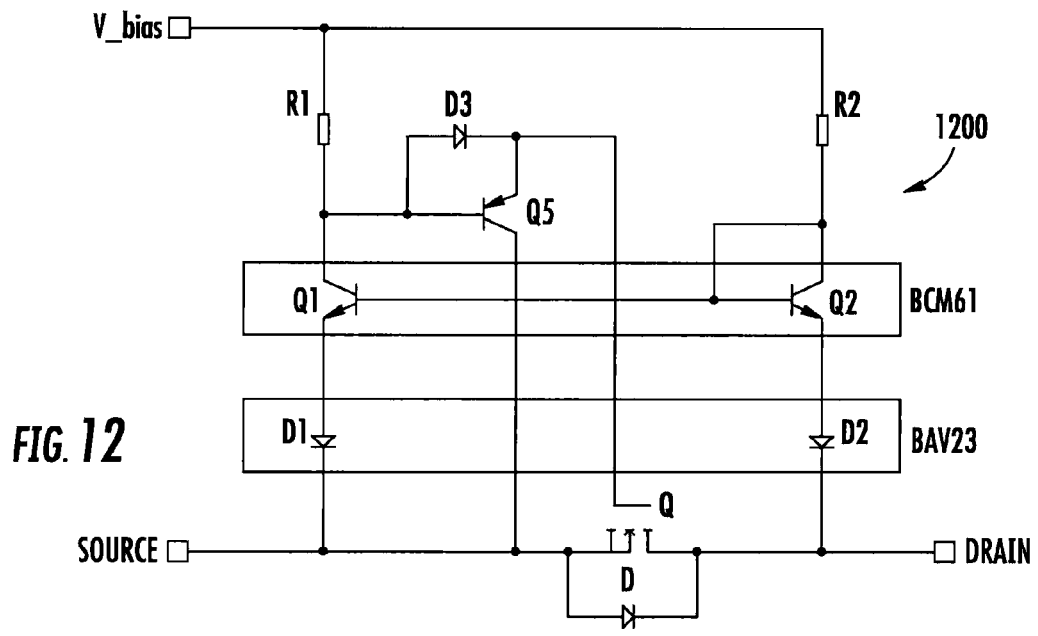

FIG. 12 illustrates a schematic view of a control circuit including a switching device and means for adjusting a switching time of the switching device.

Figure 13:
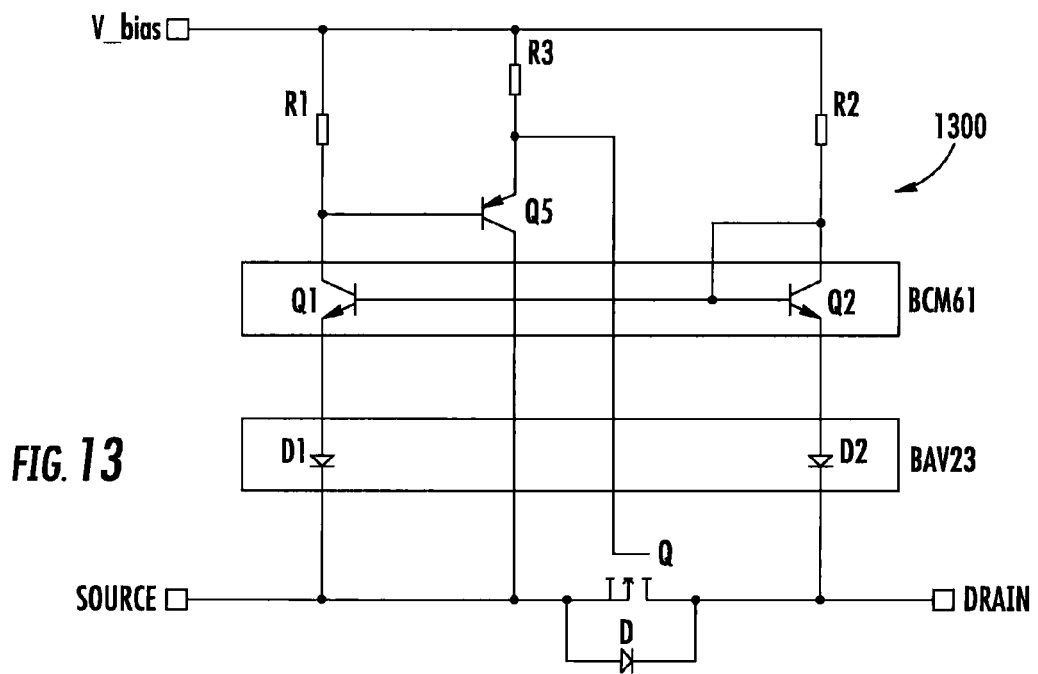

FIG. 13 illustrates a schematic view of a control circuit including a switching device and means for adjusting a switching time of the switching device.

Figure 14:
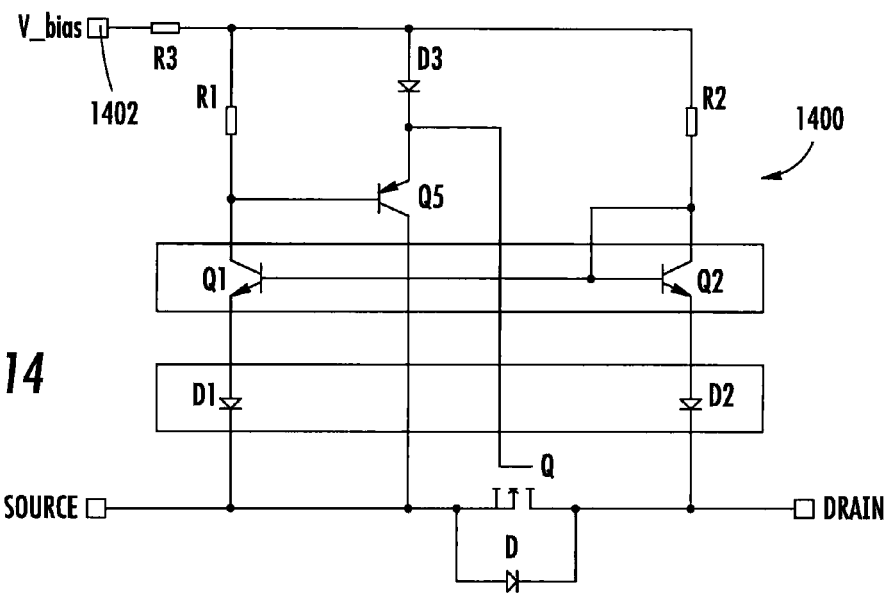

FIG. 14 illustrates a schematic view of a control circuit including a resistor coupled to a bias voltage source.

Figure 15:
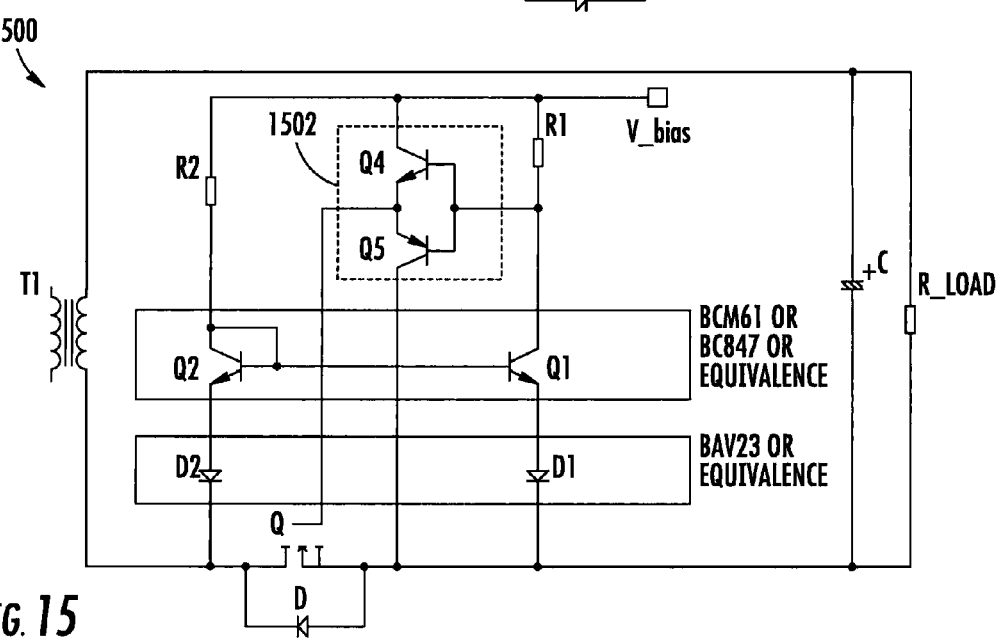

FIG. 15 illustrates a synchronous rectifier with a control circuit according to the present disclosure.

Figure 16:
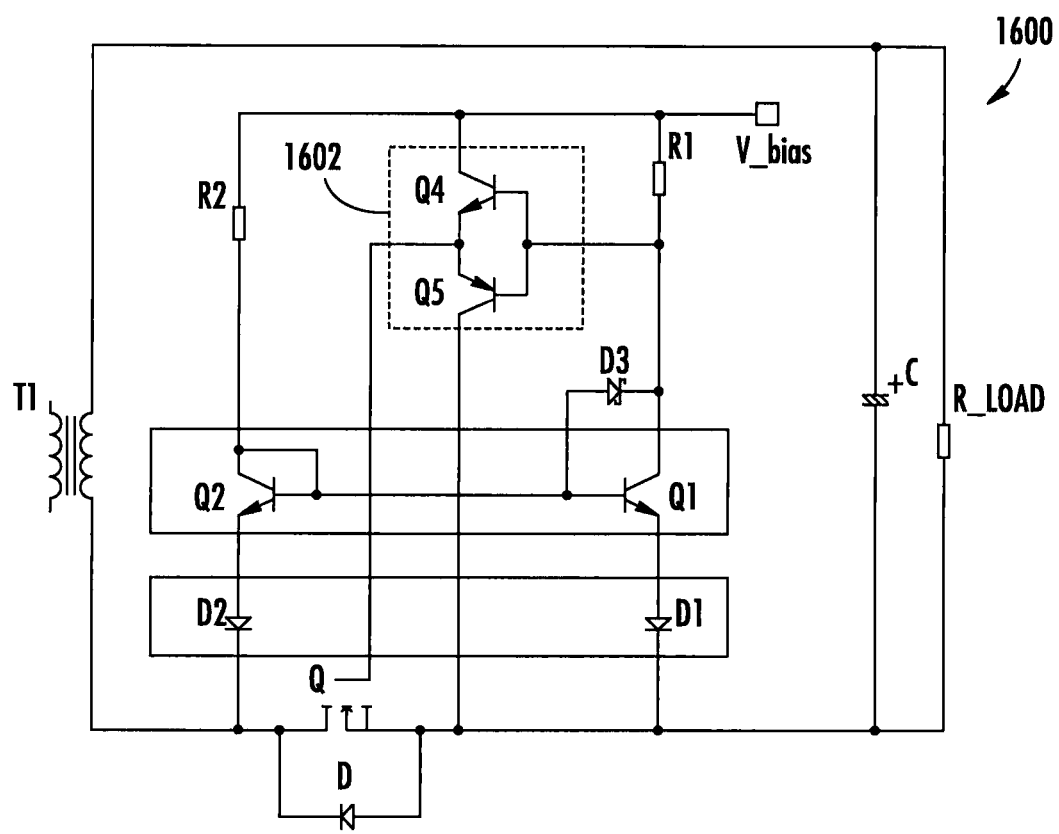

FIG. 16 illustrates a synchronous rectifier with a control circuit including a Schottky diode.

Figure 17A:
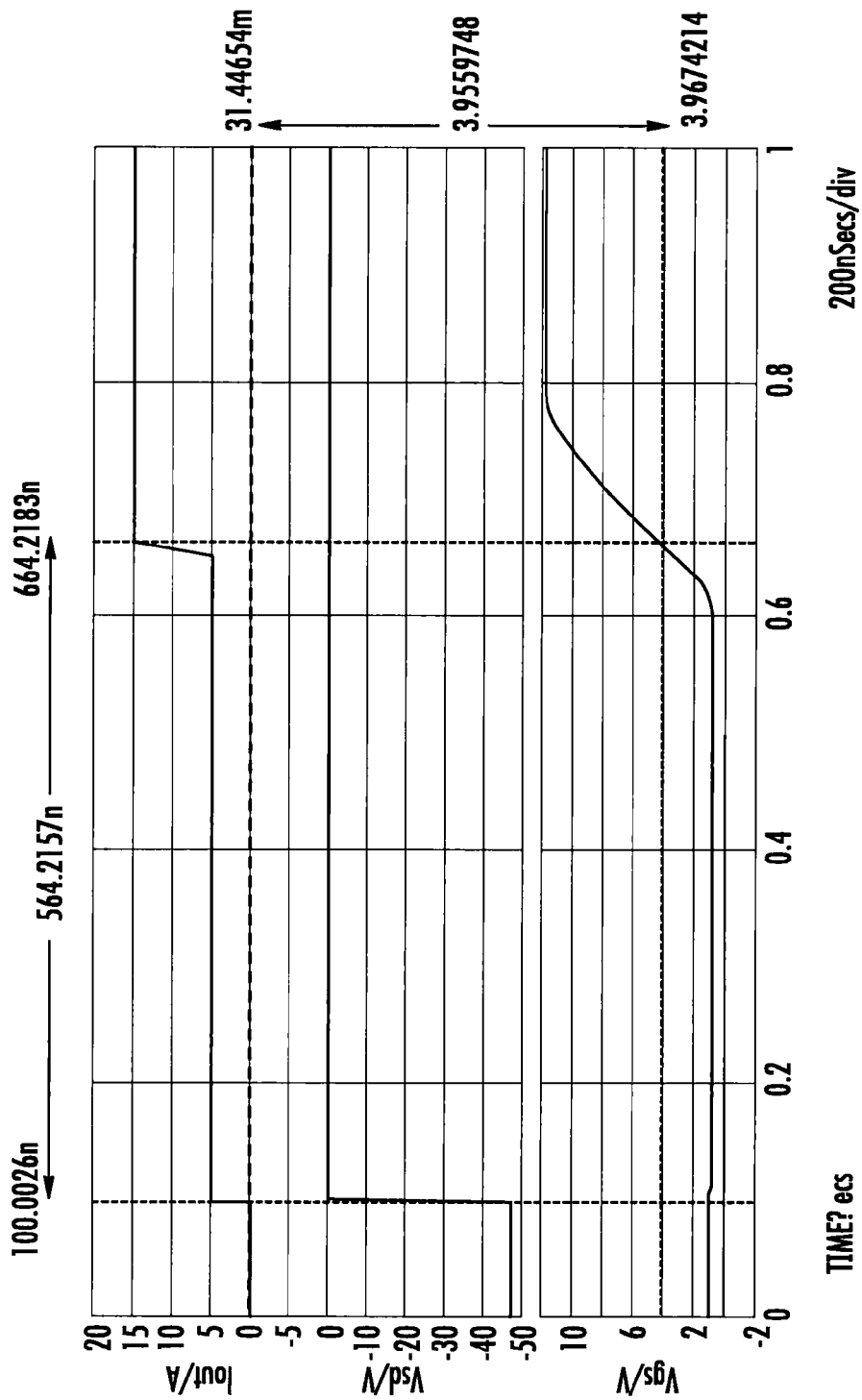
Figure 17B:
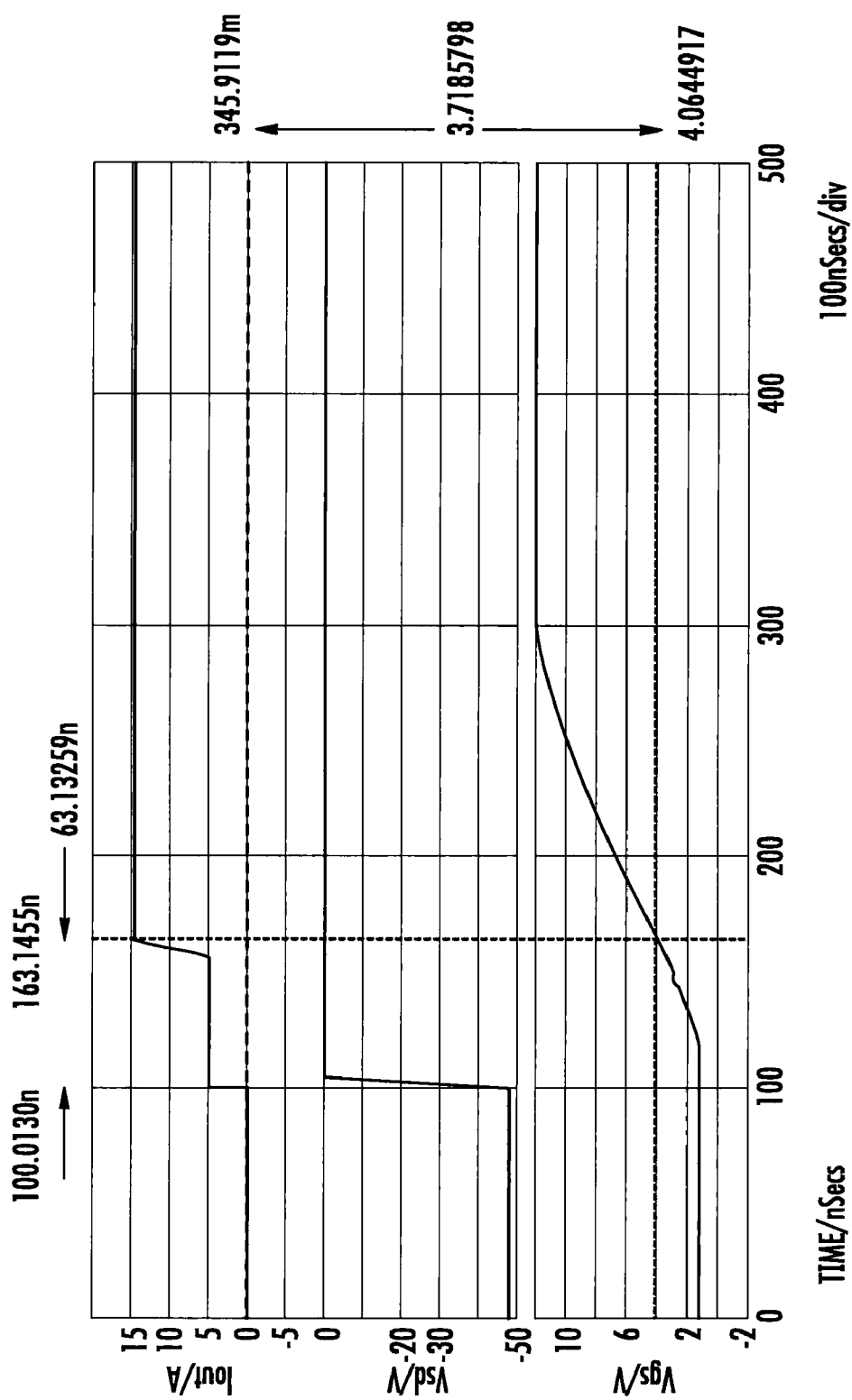

FIGS. 17A-B illustrate waveforms of simulated turn ON switching times of the switching device of FIG. 16 with and without the Schottky diode.

Figure 18A:
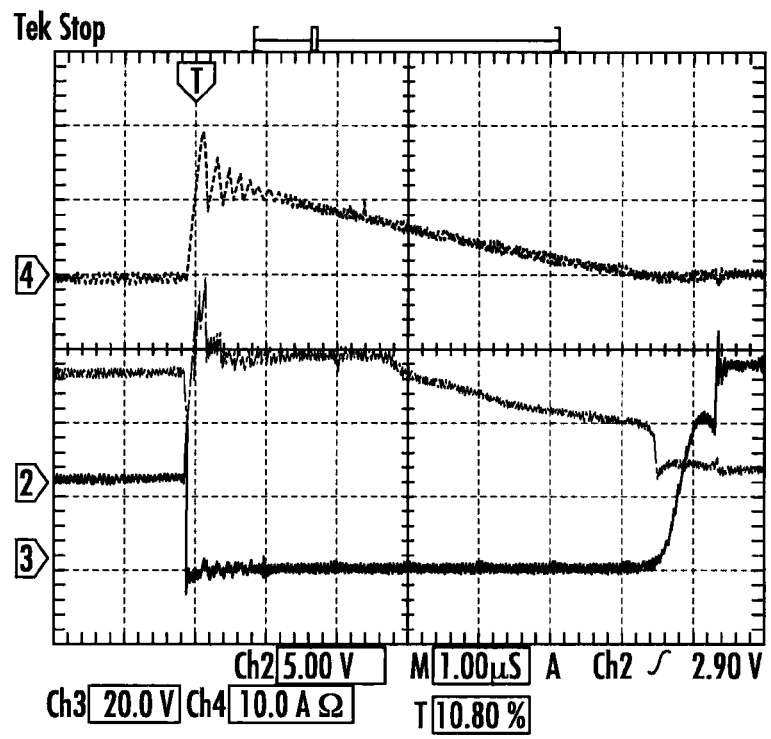
Figure 18B:
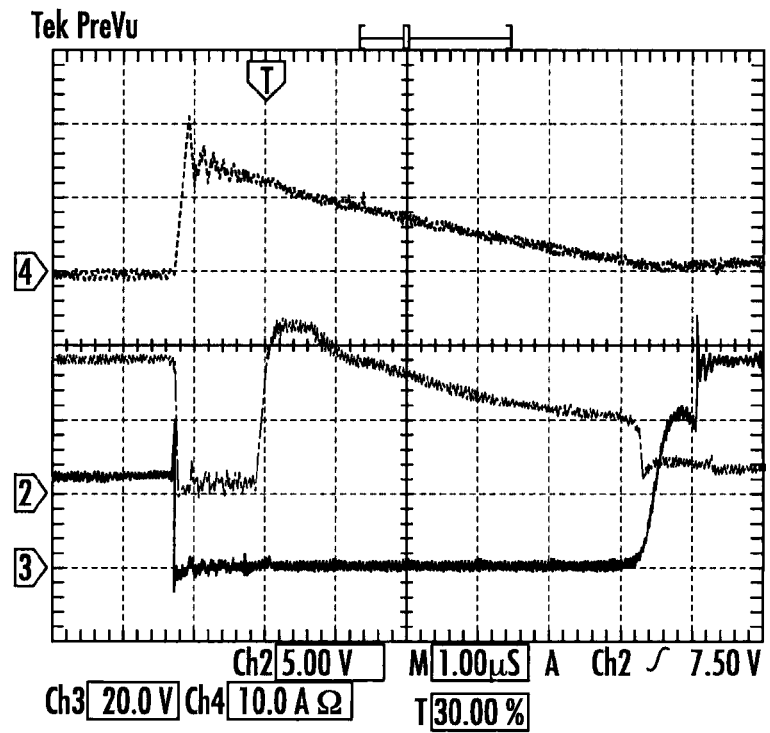

FIGS. 18A-B illustrate waveforms of measured turn ON switching times of the switching device of FIG. 16 with and without the Schottky diode.

Figure 19:
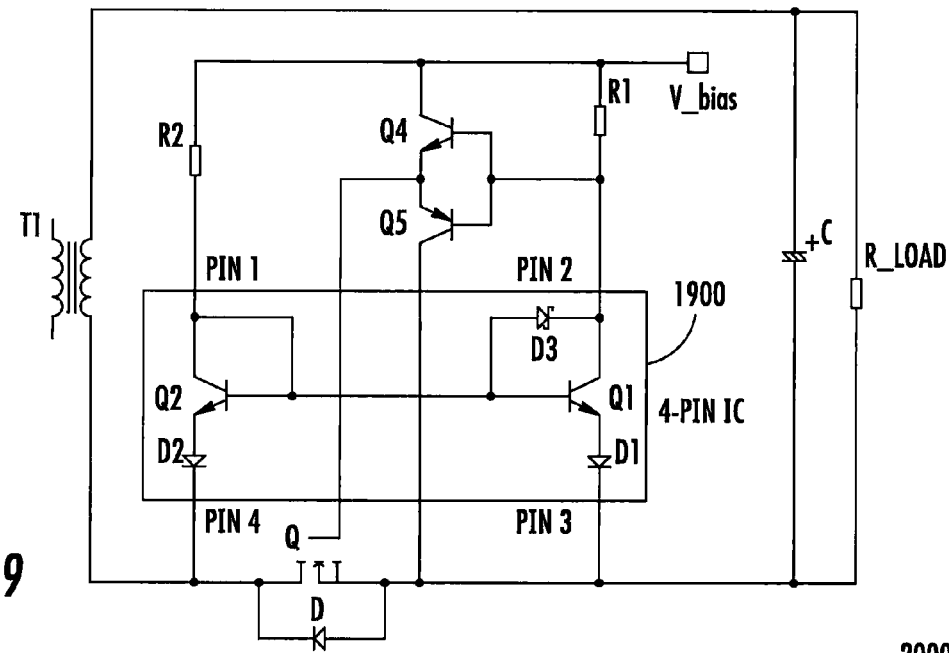

FIG. 19 illustrates a synchronous rectifier with a 4-pin integrated control circuit.

Figure 20:
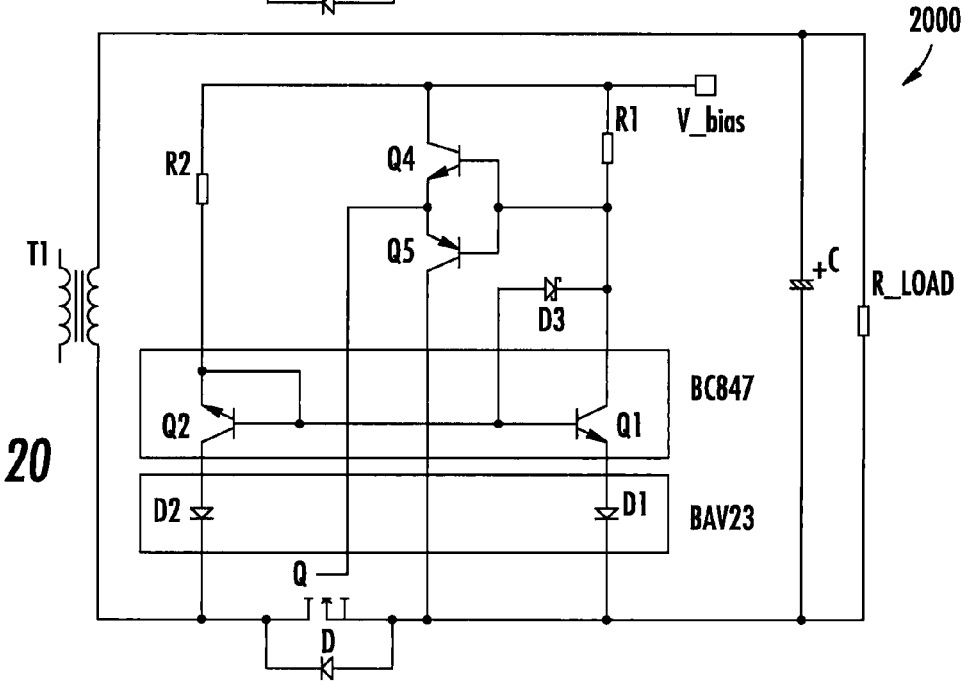

FIG. 20 illustrates a synchronous rectifier including a control circuit with unmatched transistors.

Figure 21:
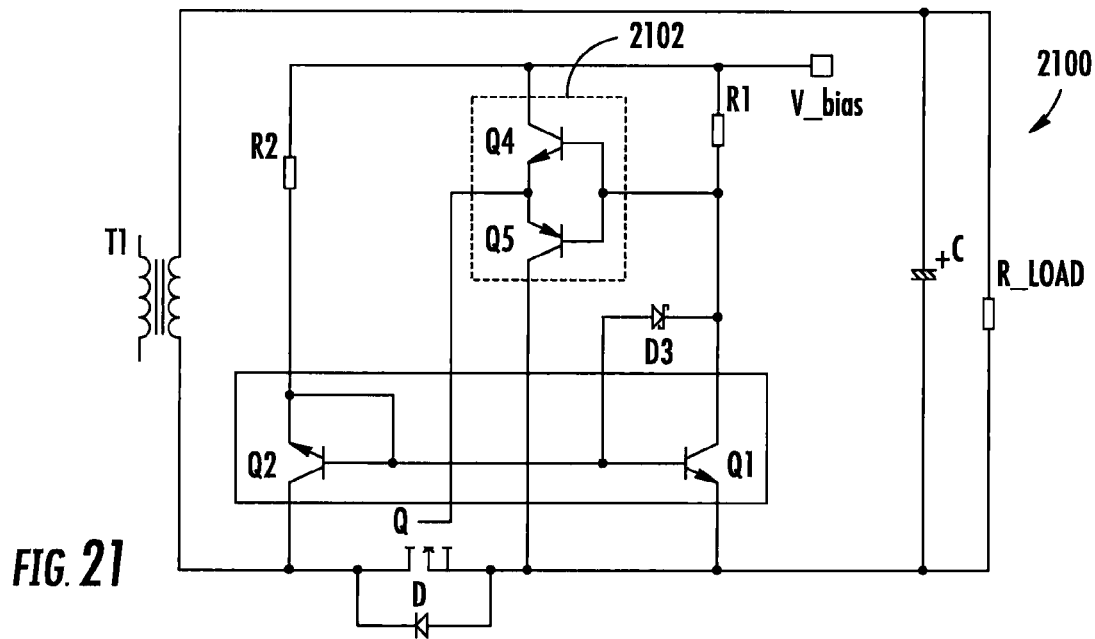

FIG. 21 illustrates a synchronous rectifier with a control circuit including transistors and a Schottky diode.

Figure 22:
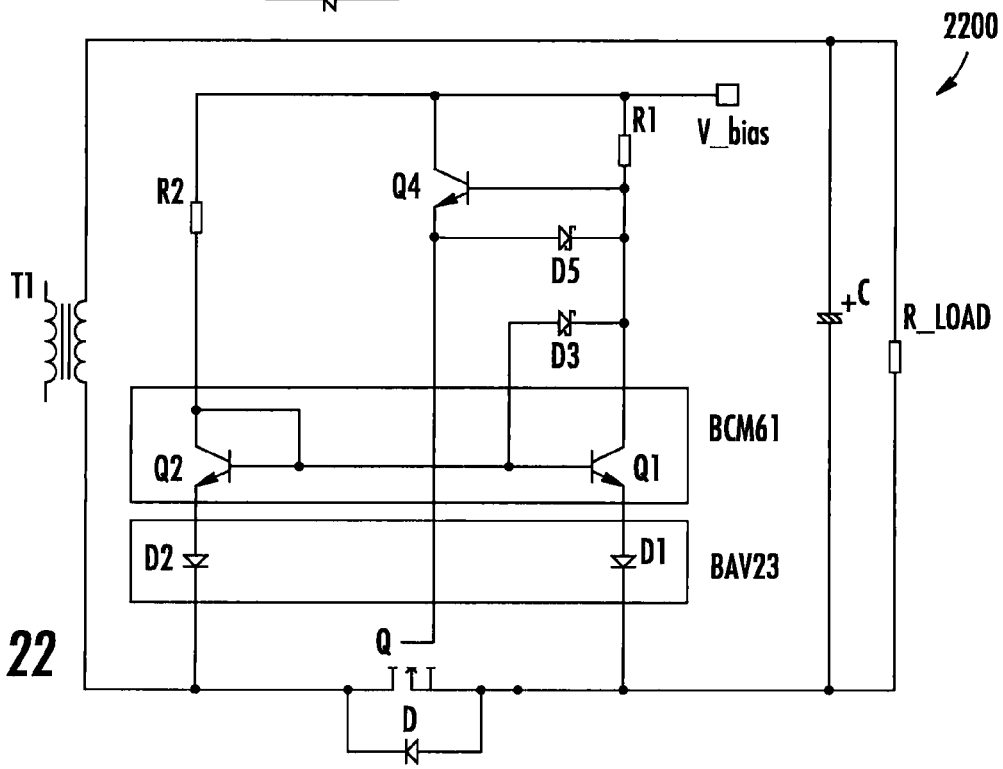

FIG. 22 illustrates a synchronous rectifier including a control circuit with means for adjusting a switching time including two diodes.

Figure 23A:
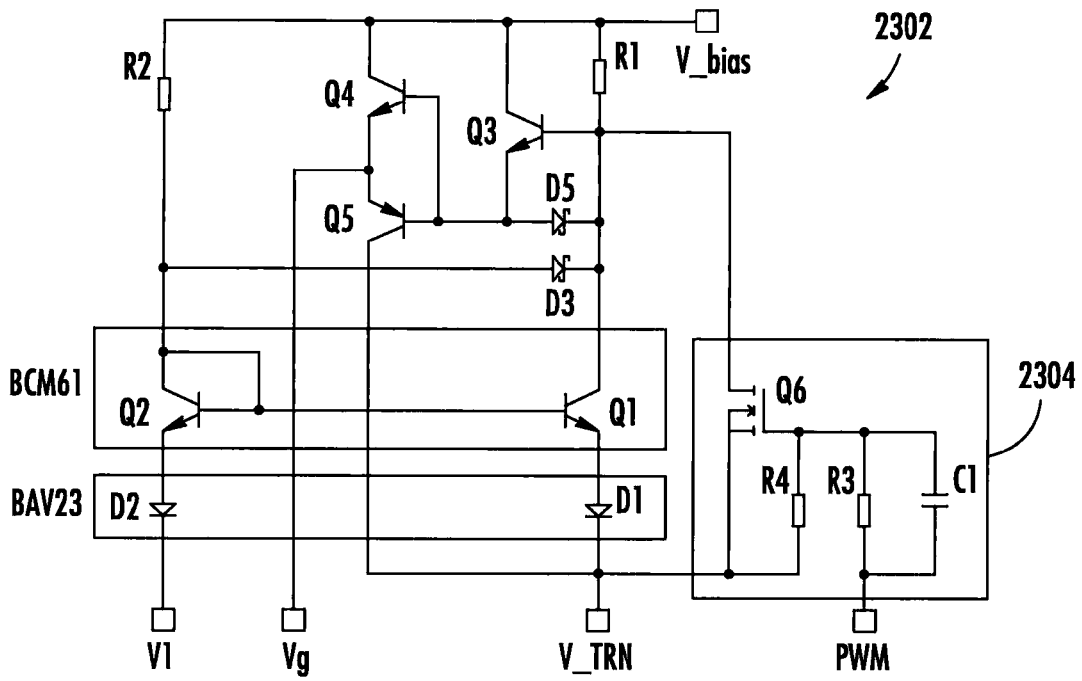
Figure 23B:
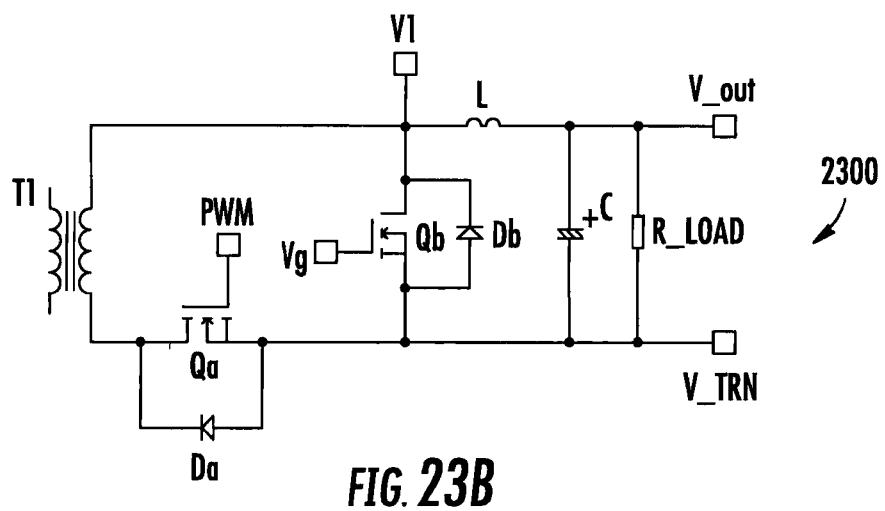

FIGS. 23A-B illustrate a power supply and a synchronous rectifier including a control circuit with an auxiliary circuit according to the present disclosure.

FIGS. 24A-D illustrate waveforms simulated turn ON and OFF switching times of the synchronous rectifier of FIG. 23.

Figure 25A:
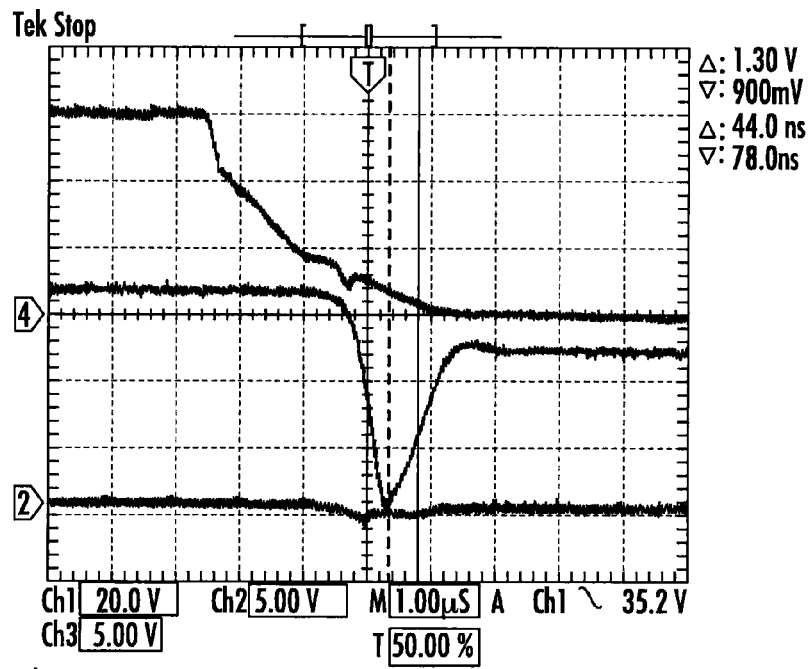
Figure 25B:
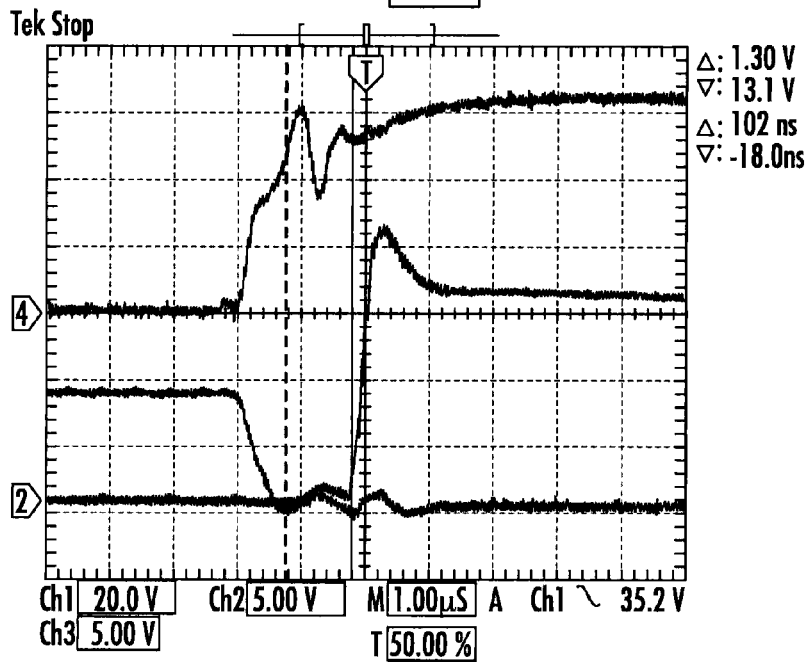

FIGS. 25A-B illustrate waveforms of measured turn ON and OFF switching times of the synchronous rectifier of FIG. 23 under at full load condition.

FIGS. 26A-D illustrate waveforms of measured turn ON and OFF switching times of the synchronous rectifier of FIG. 23 under various load conditions.

Figure 27A:
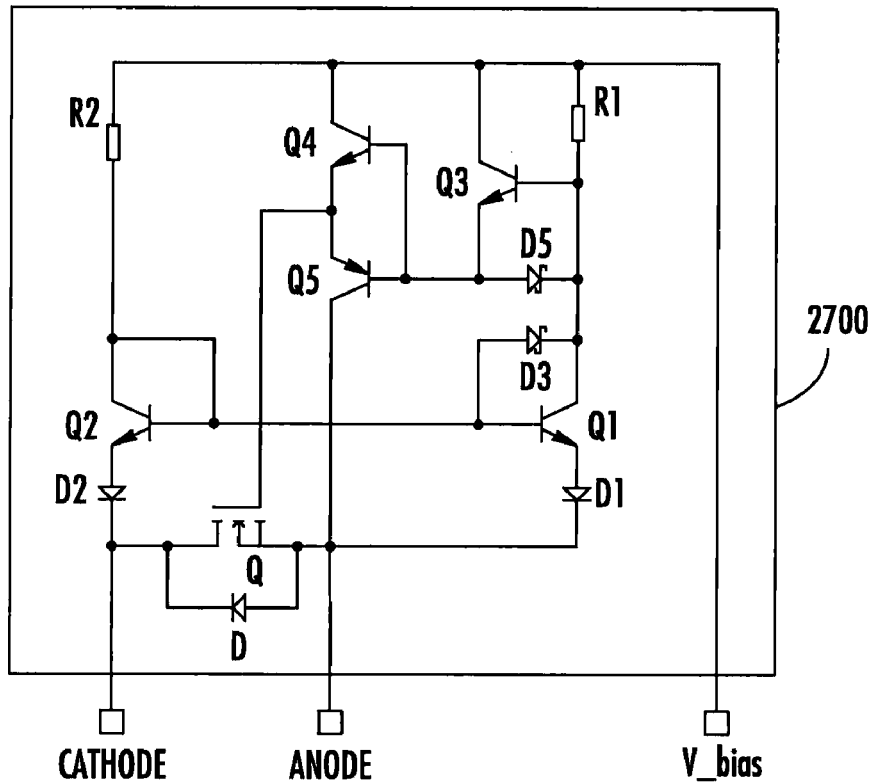
Figure 27B:
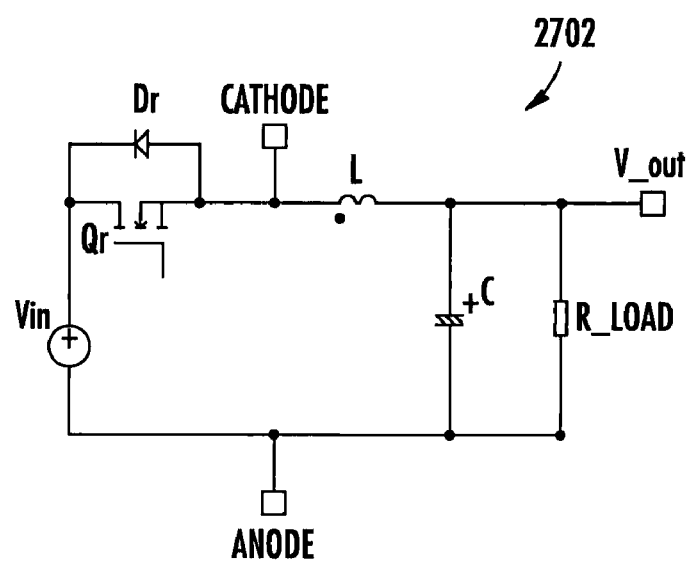

FIGS. 27A-B illustrate a schematic view of a power supply and integrated circuit including a control circuit with a Darlington circuit.

Figure 28:
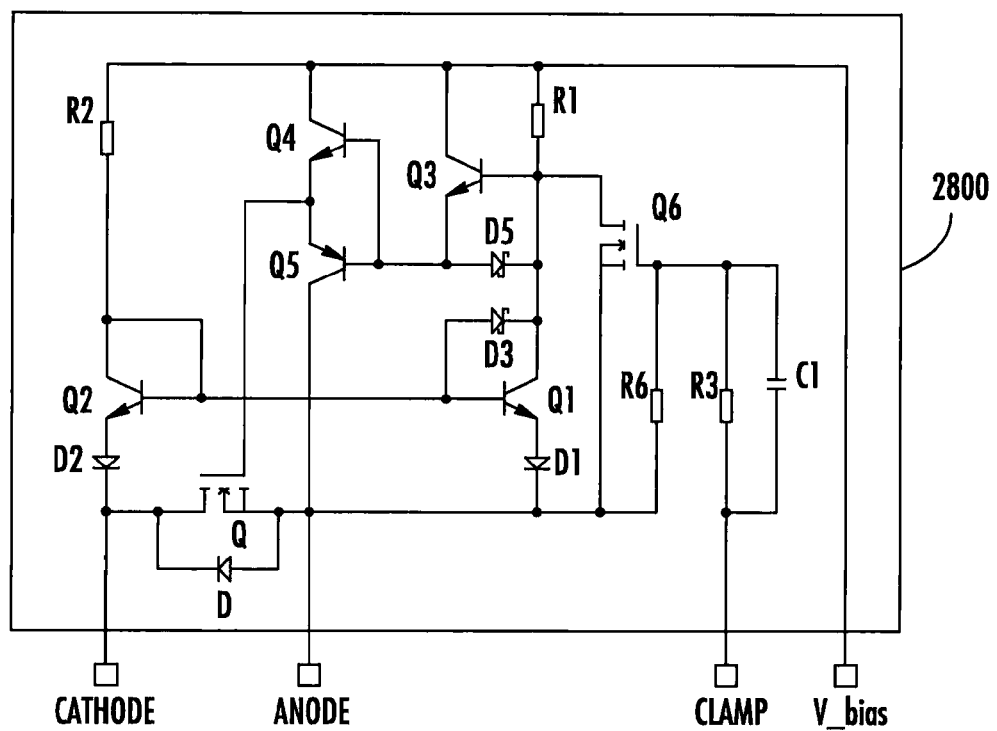

FIG. 28 illustrates a schematic view of an integrated circuit including a control circuit with an auxiliary circuit.

Figure 29A:
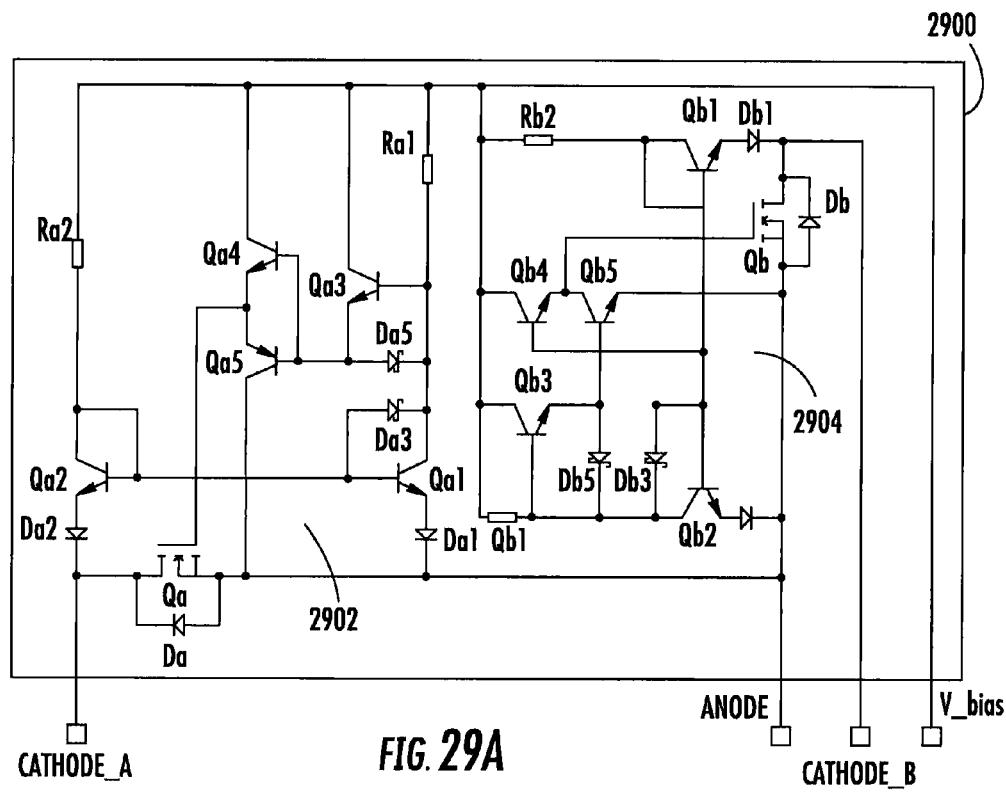
Figure 29B:
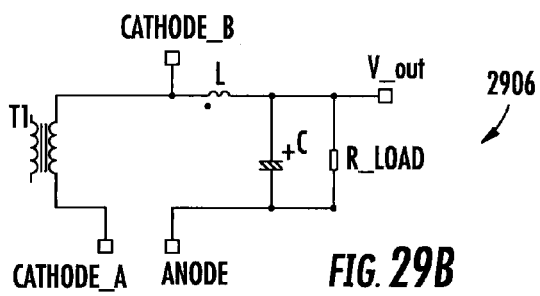

FIGS. 29A-B illustrate a schematic view of a power supply and a dual cathode integrated circuit including two switching devices and two control circuits.

Figure 30:
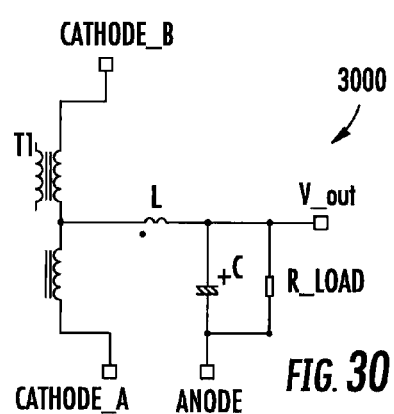

FIG. 30 illustrates a schematic view of a power supply with a push-pull converter topology.

Figure 31A:
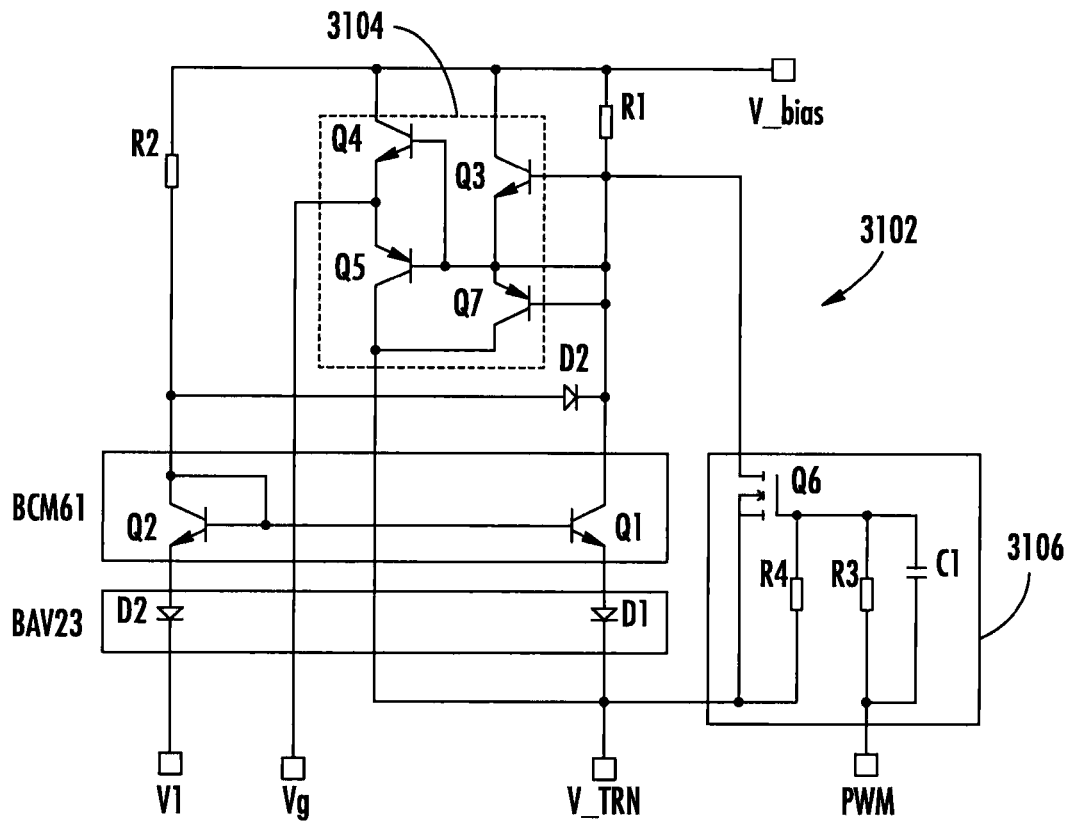
Figure 31B:
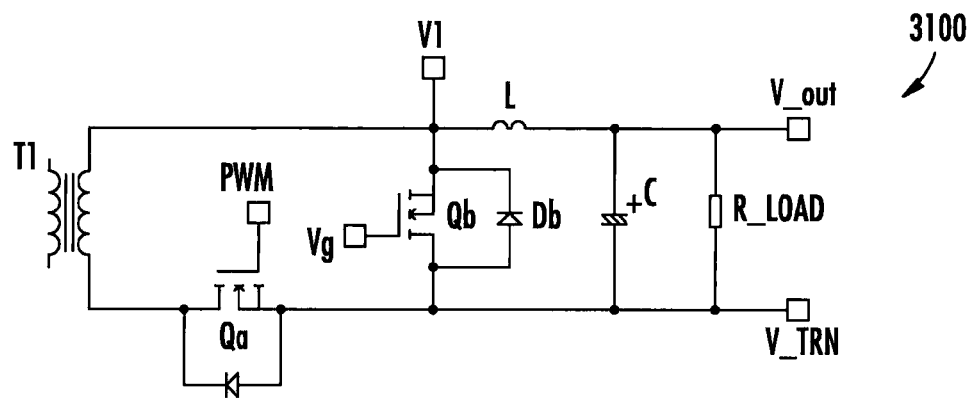

FIGS. 31A-B illustrate a schematic view of a power supply and control circuit with a dual totem pole circuit.

Figure 32:
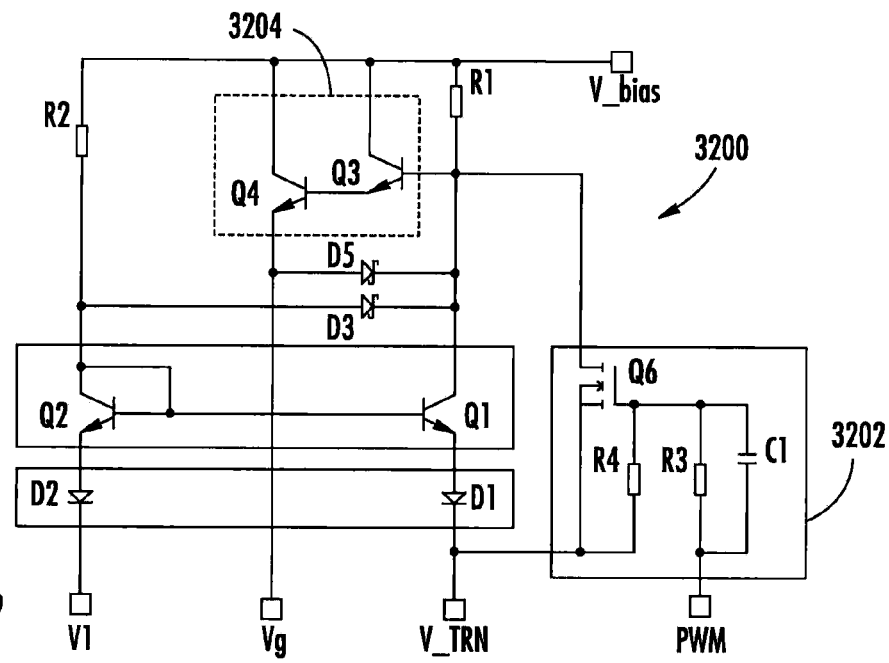

FIG. 32 illustrates a schematic view of a control circuit with means for adjusting a switching time of the switching device.

Figure 33:
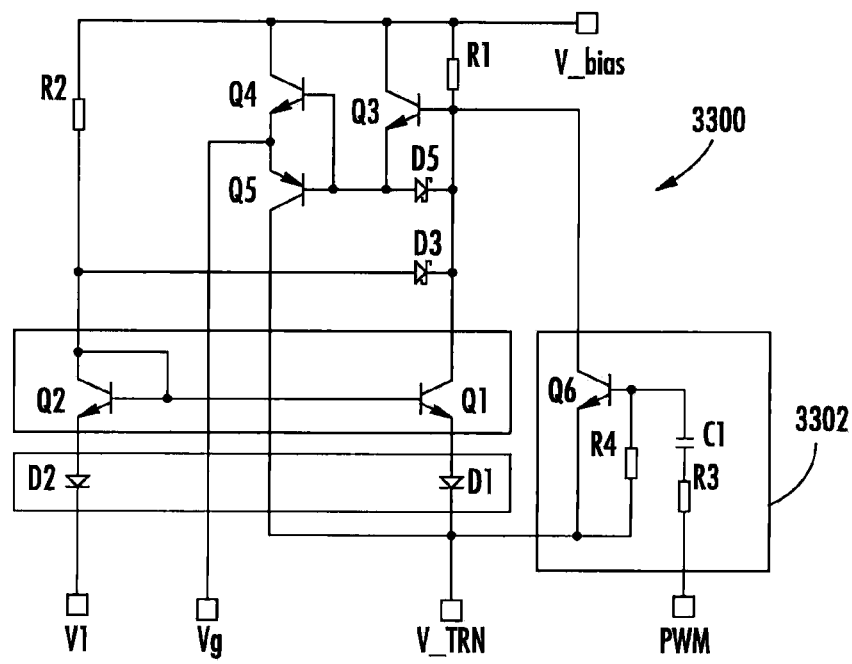

FIG. 33 illustrates a schematic view of a control circuit with an auxiliary circuit.

Figure 34:
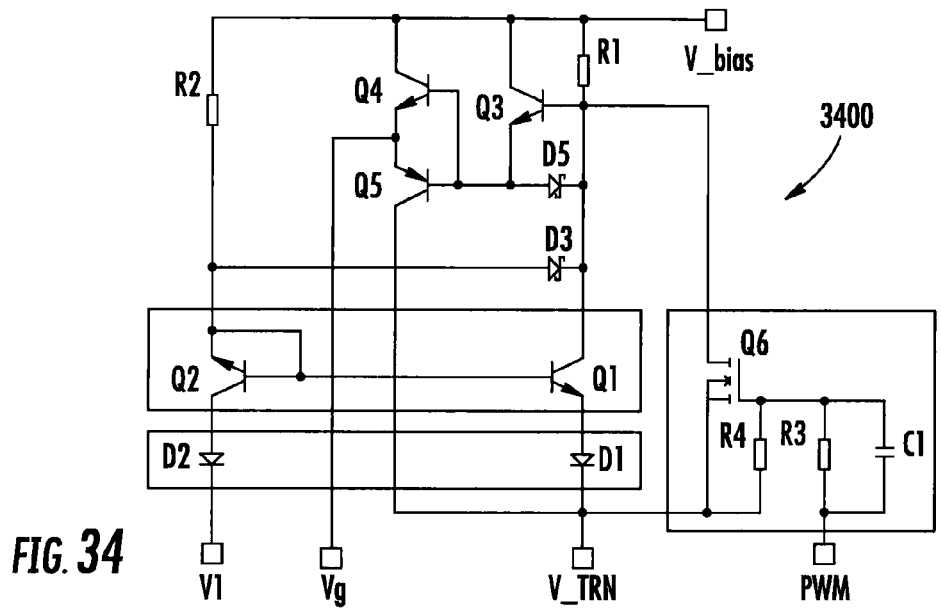

FIG. 34 illustrates a schematic view of a control circuit with unmatched transistors.

Figure 35:
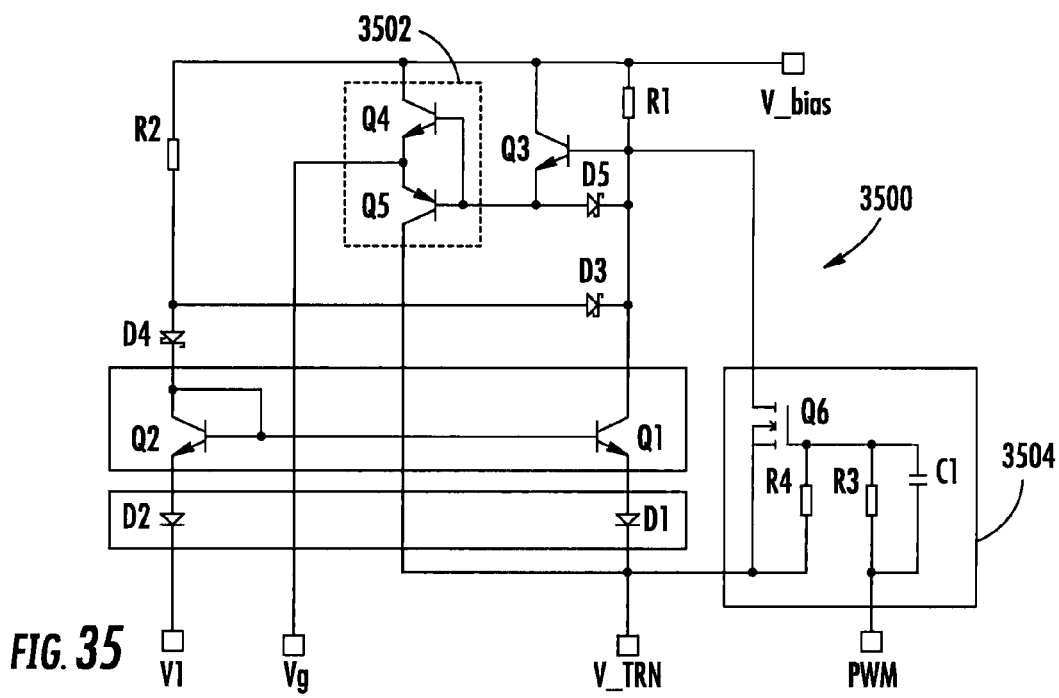

FIG. 35 illustrates a schematic view of a control circuit with a Baker clamp circuit.

Figure 36:
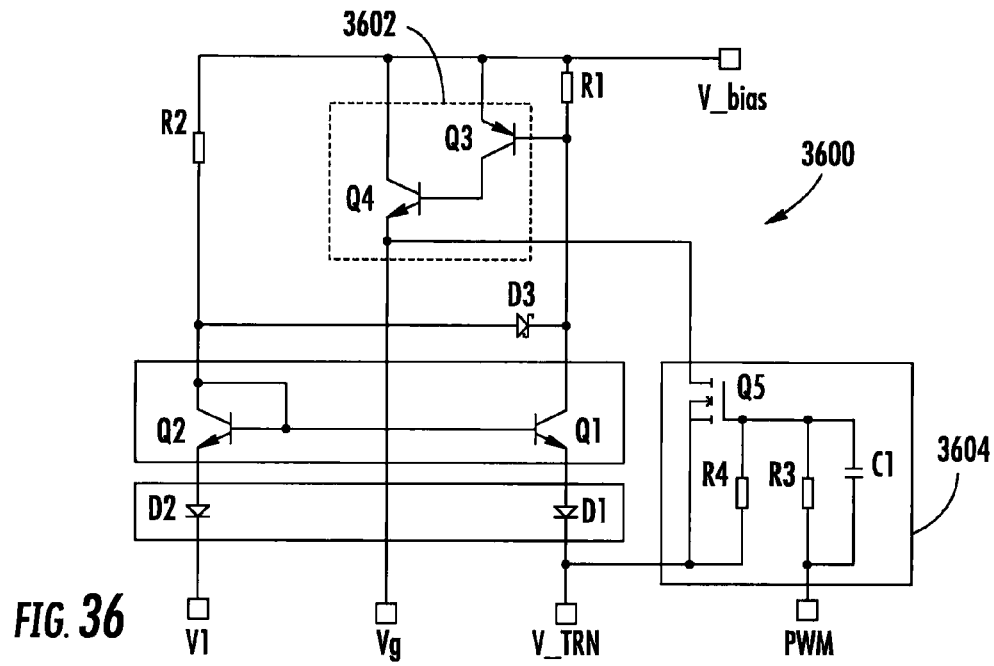

FIG. 36 illustrates a schematic view of a simplified control circuit.

Figure 37:
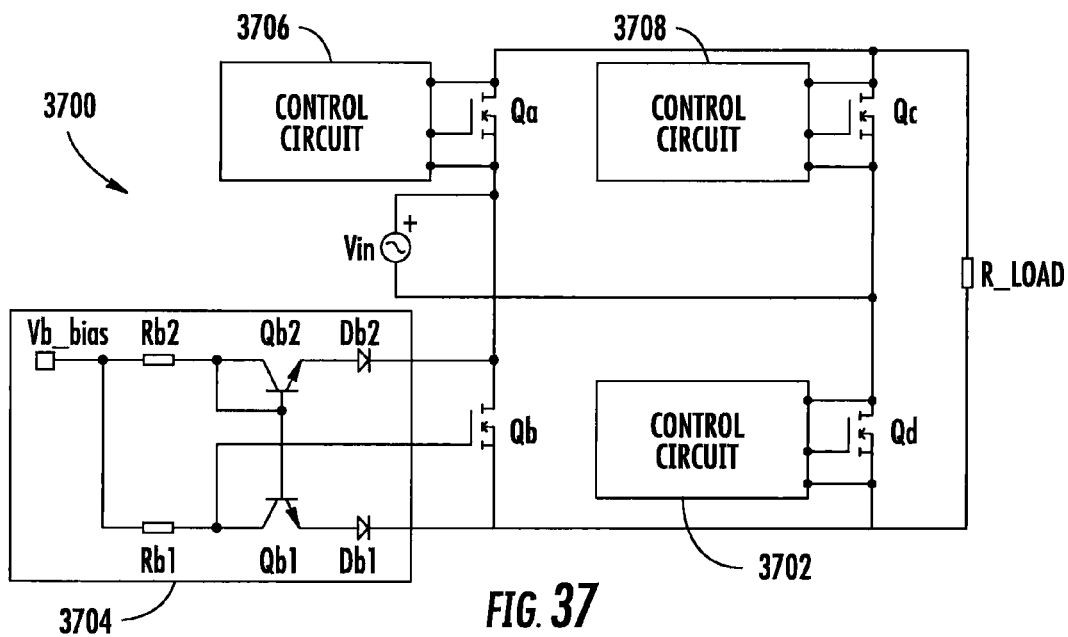

FIG. 37 illustrates a schematic view of a full-bridge rectifier according to the present disclosure.

Figure 38A:
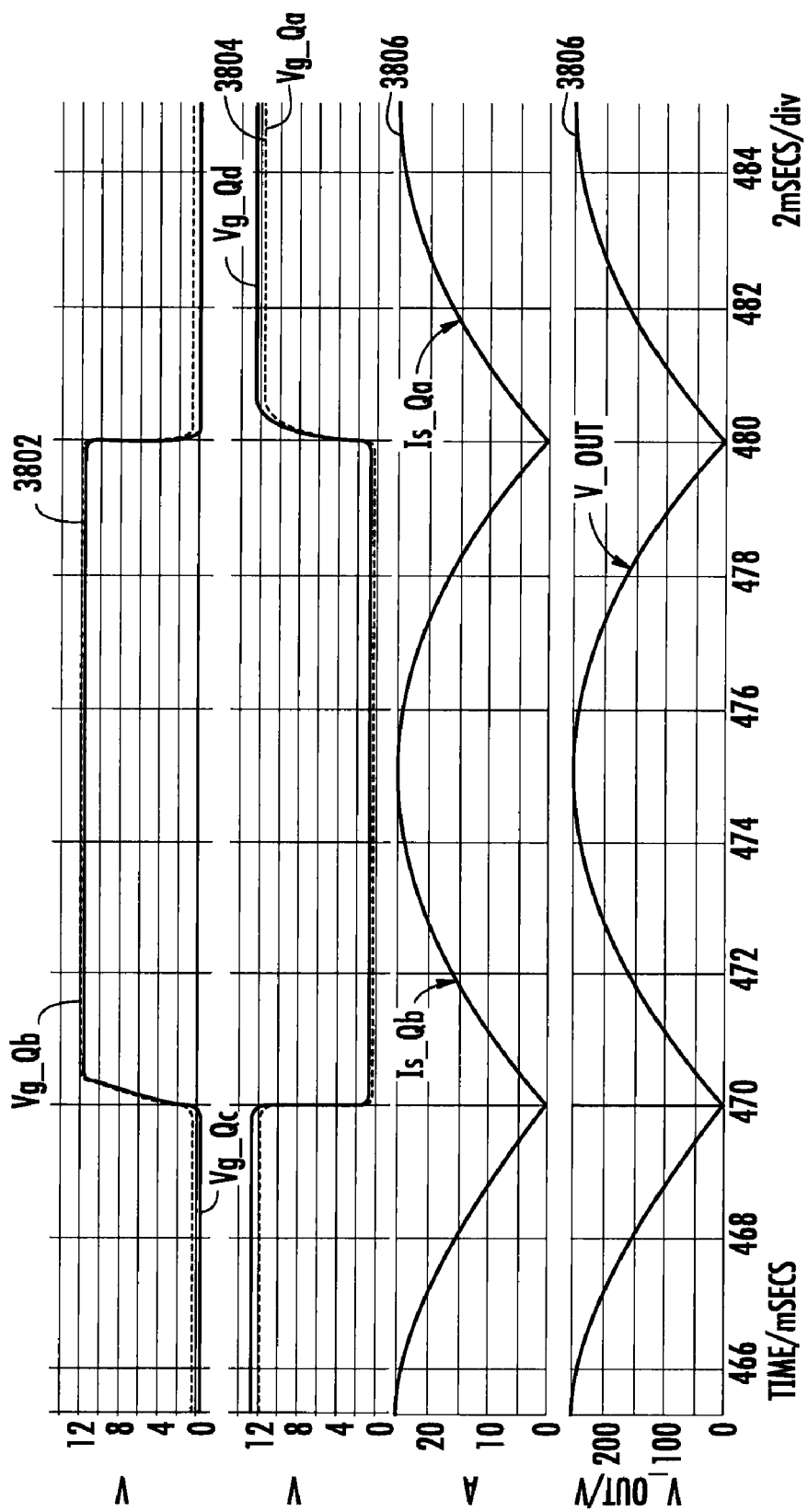
Figure 38B:
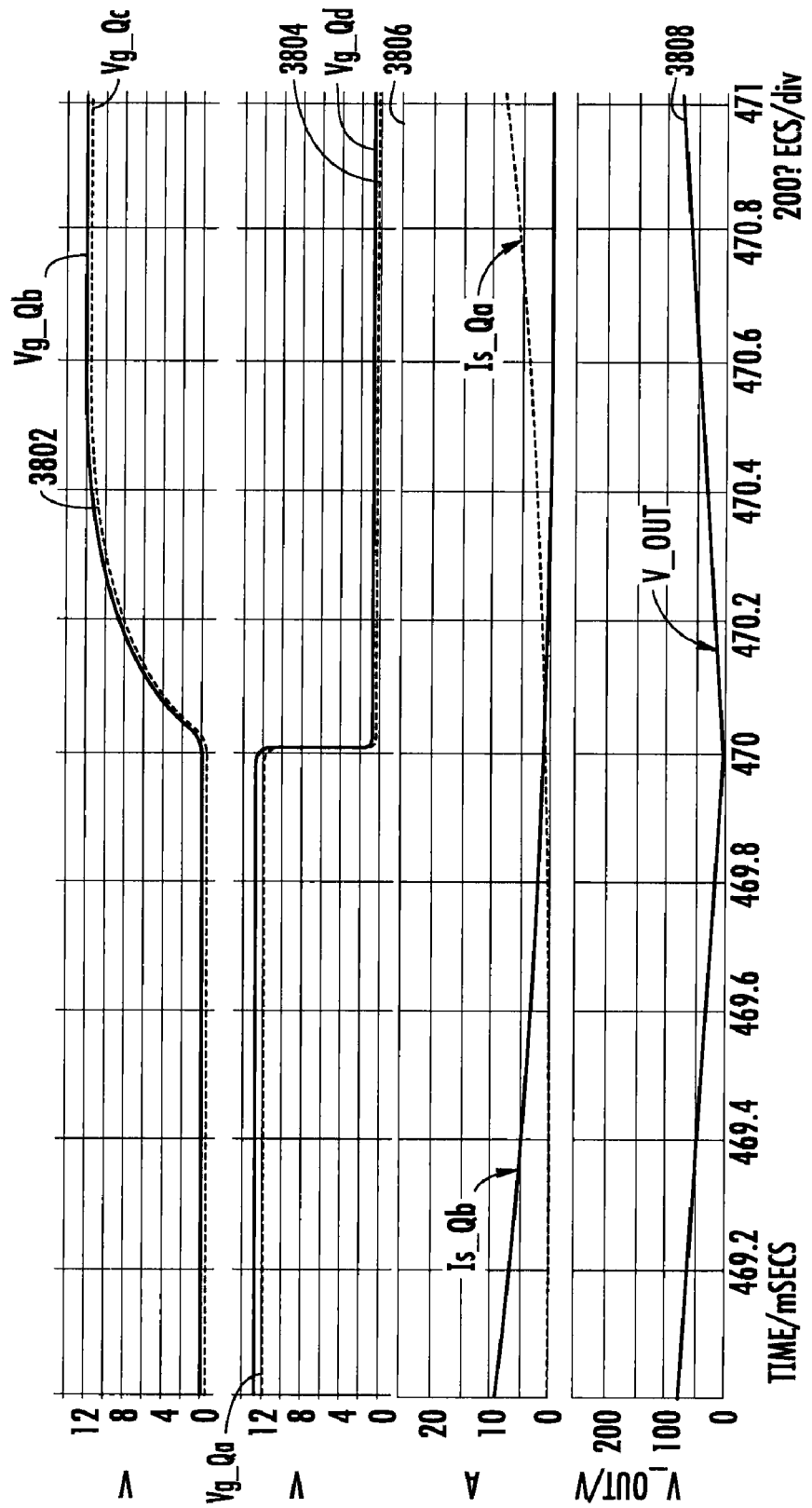

FIGS. 38A-B illustrate waveforms of simulated switching times of switching devices included in FIG. 37.

Figure 39A:
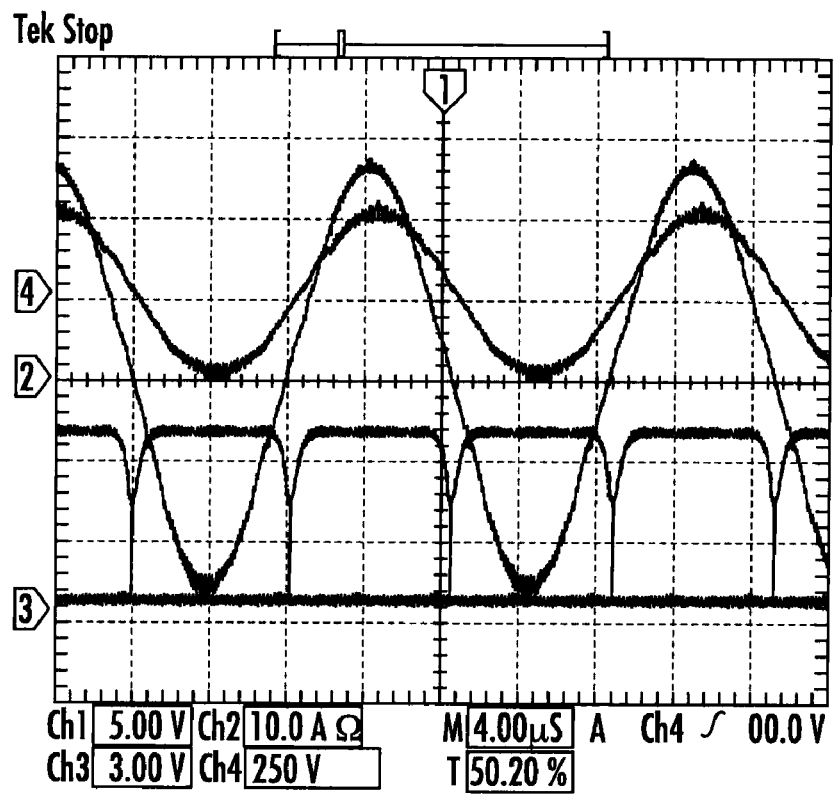
Figure 39B:
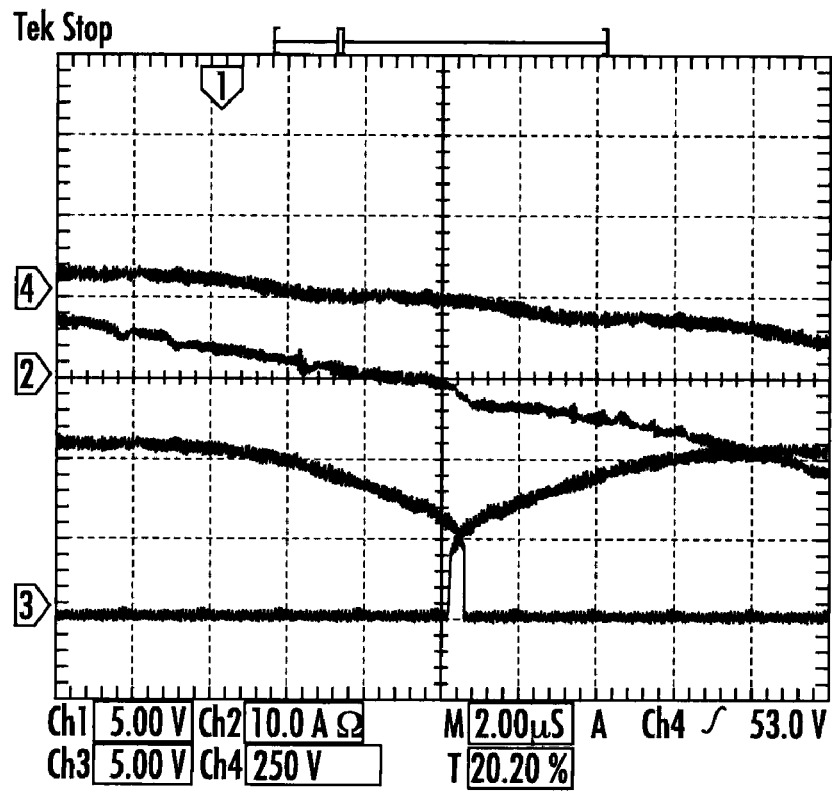

FIGS. 39A-B illustrate waveforms of measured switching times of switching devices included in FIG. 37.

Figure 40:
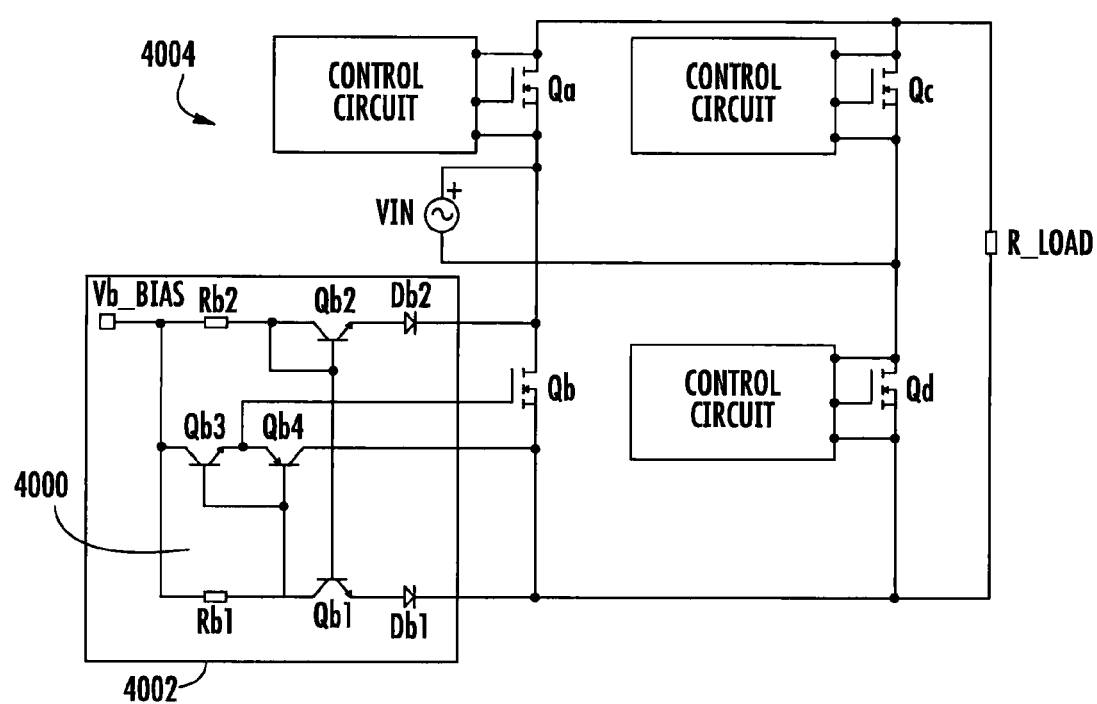

FIG. 40 illustrates a schematic view of a full-bridge rectifier including totem pole circuit.

Figure 41:
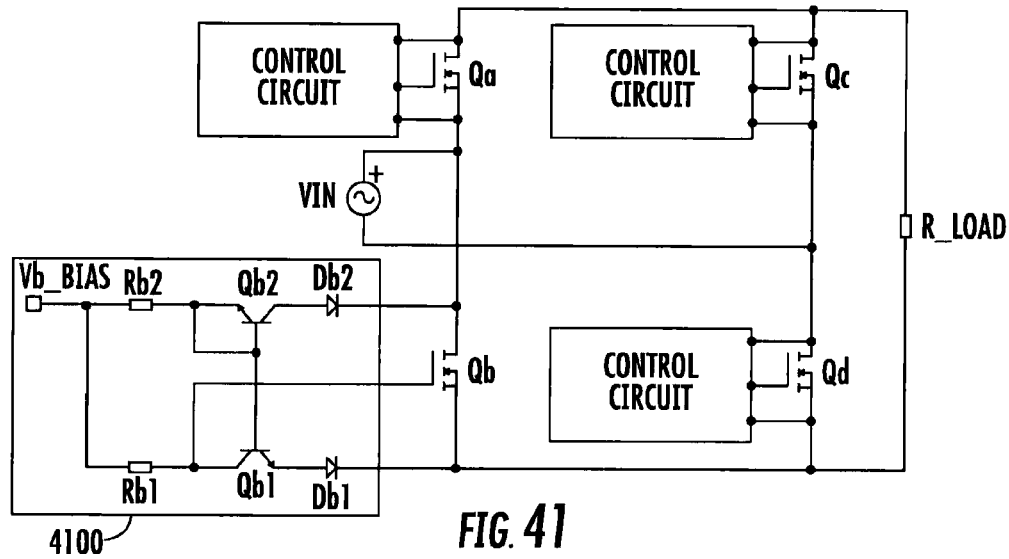

FIG. 41 illustrates a schematic view of a full-bridge rectifier with unmatched transistors.

Figure 42:
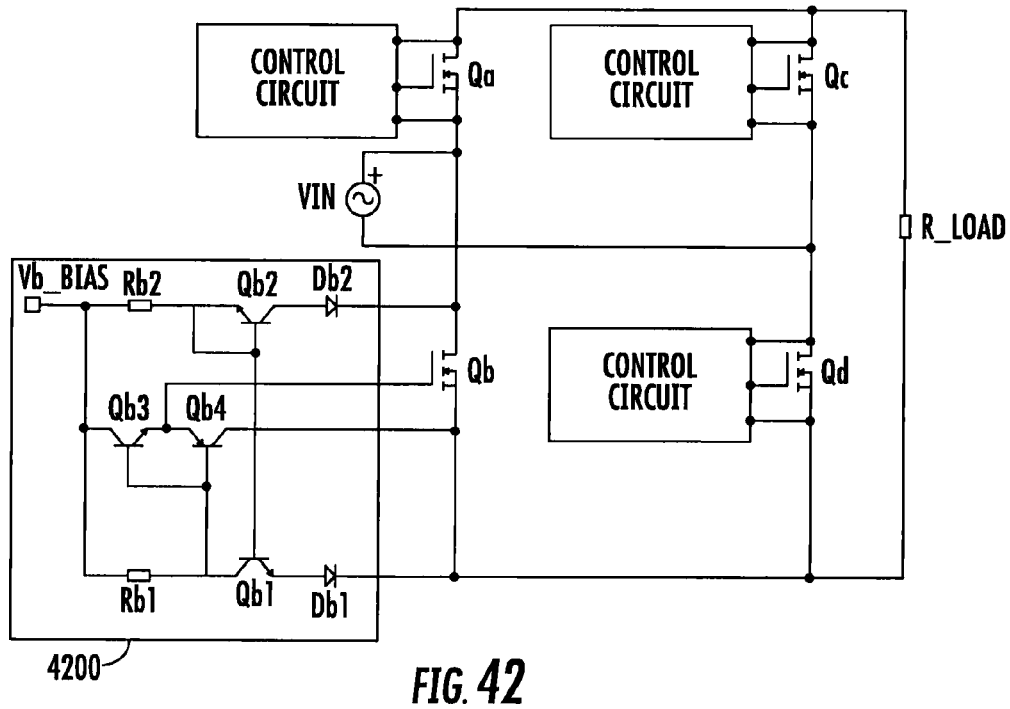

FIG. 42 illustrates a schematic view of a full-bridge rectifier with unmatched transistors and a totem pole circuit.

Figure 43:
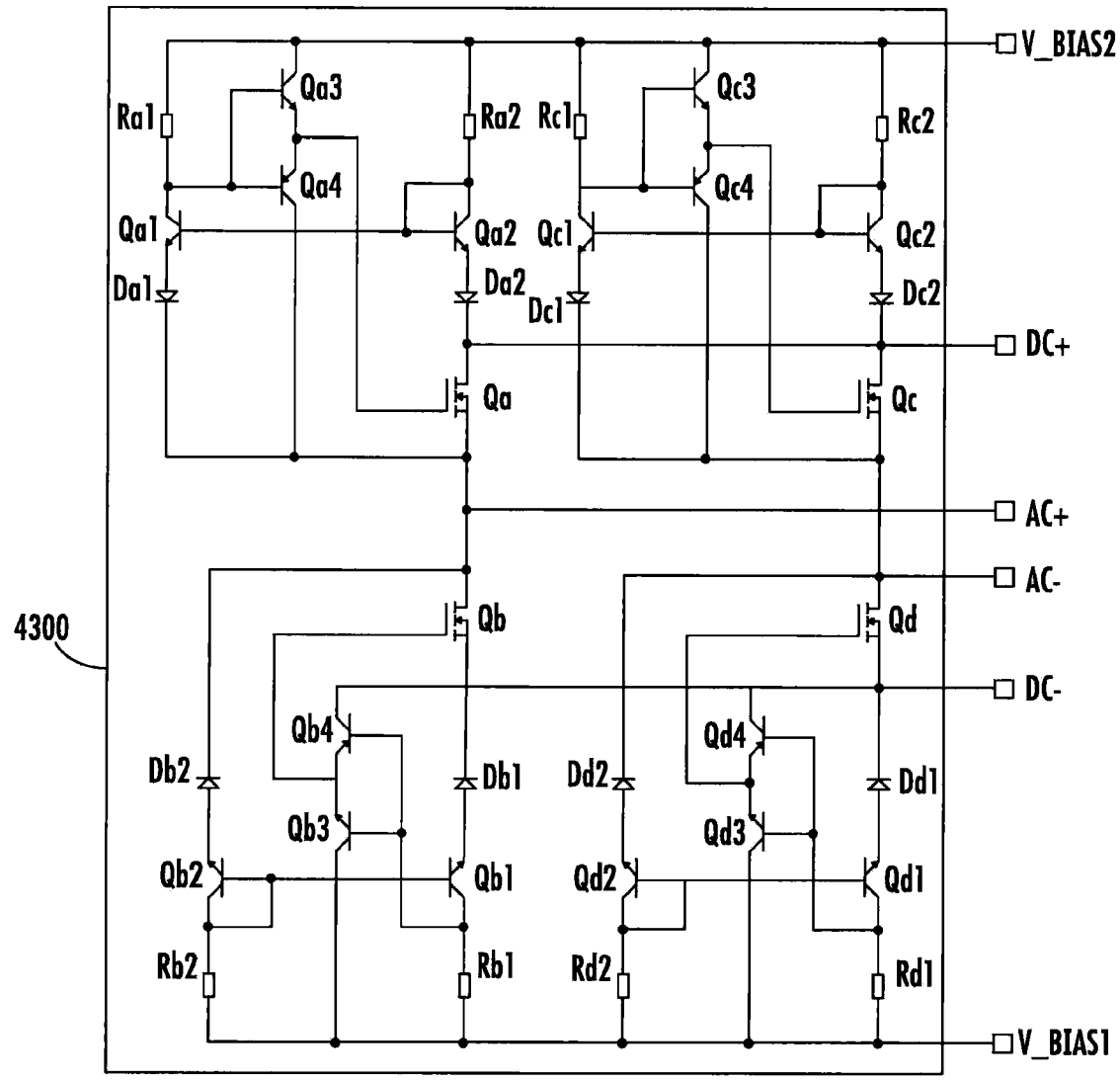

FIG. 43 illustrates a schematic view of an integrated circuit including a full-bridge rectifier according to the present disclosure.

Figure 44A:
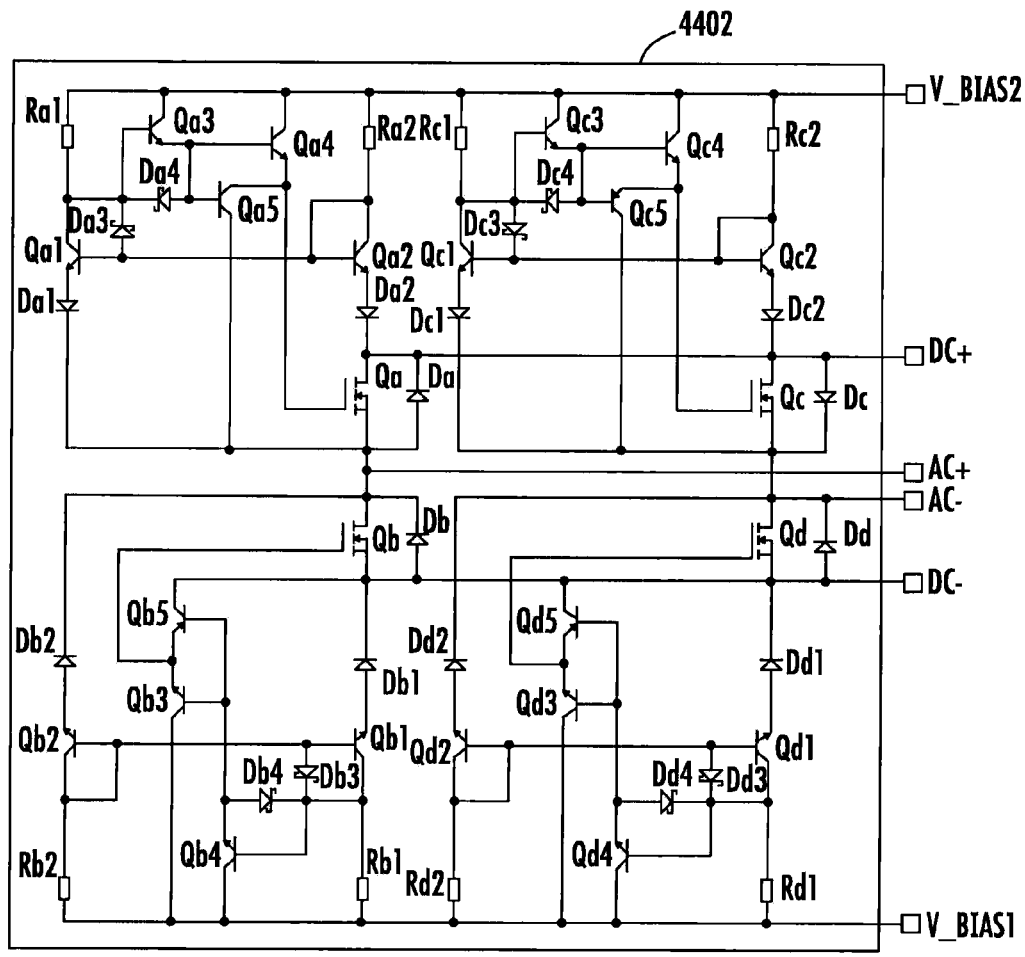
Figure 44B:
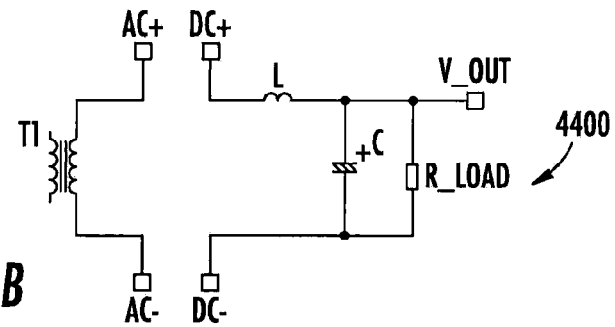

FIGS. 44A-B illustrate schematic views of a power supply and an integrated circuit including a full bridge rectifier.

Figure 45:
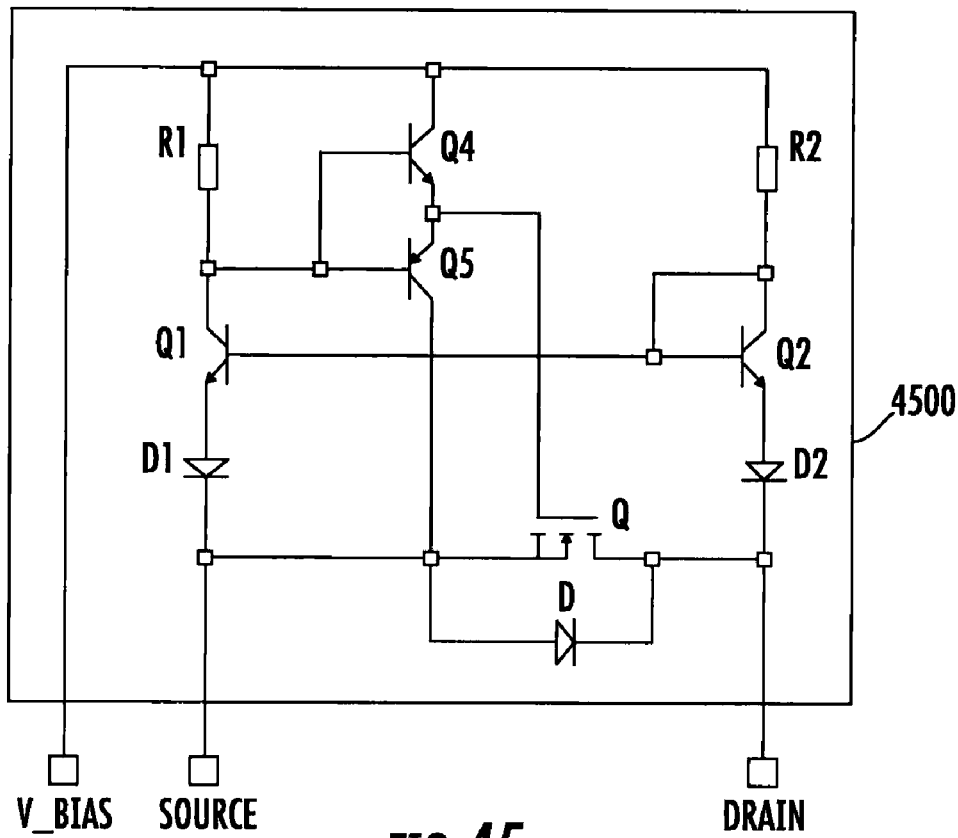

FIG. 45 illustrates a 3-pin integrated circuit including a control circuit with a totem pole circuit.

Figure 46:
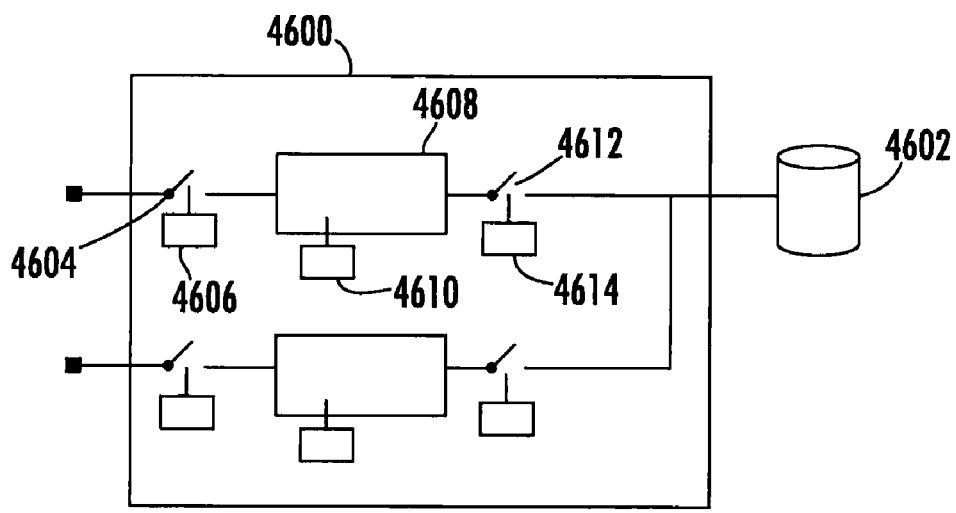

FIG. 46 illustrates a block diagram of a multi-stage power supply including switching devices and control circuits.

DETAILED DESCRIPTION

The following description is merely exemplary in nature and is not intended to limit the present disclosure, application, or uses.

Figure 1:
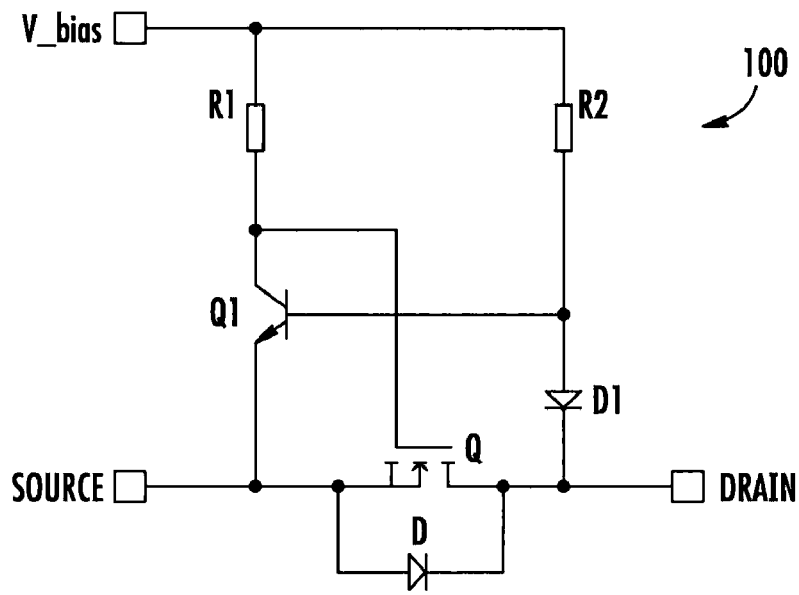
FIG. 1 illustrates a schematic view of a MOSFET controller according to the Prior Art.
Figure 2:
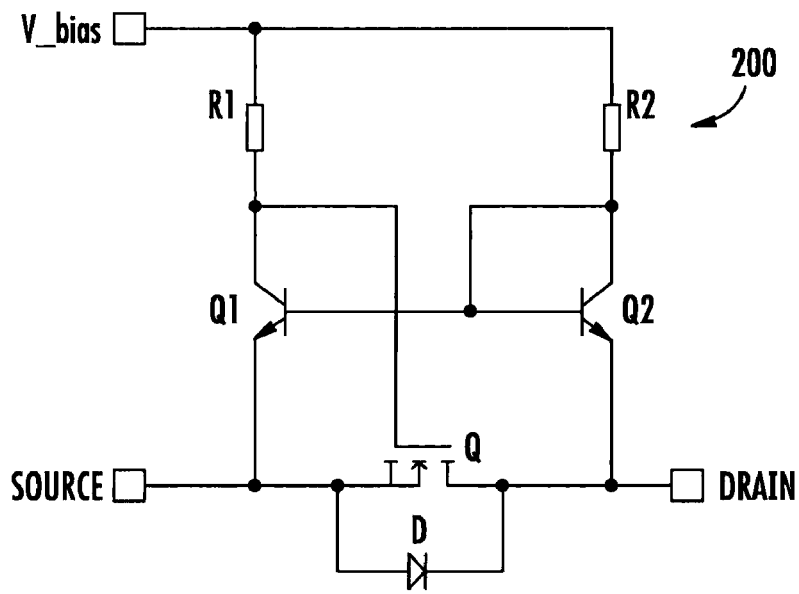
FIG. 2 illustrates a schematic view of a MOSFET controller including bipolar junction transistors according to the Prior Art.
Figure 3:
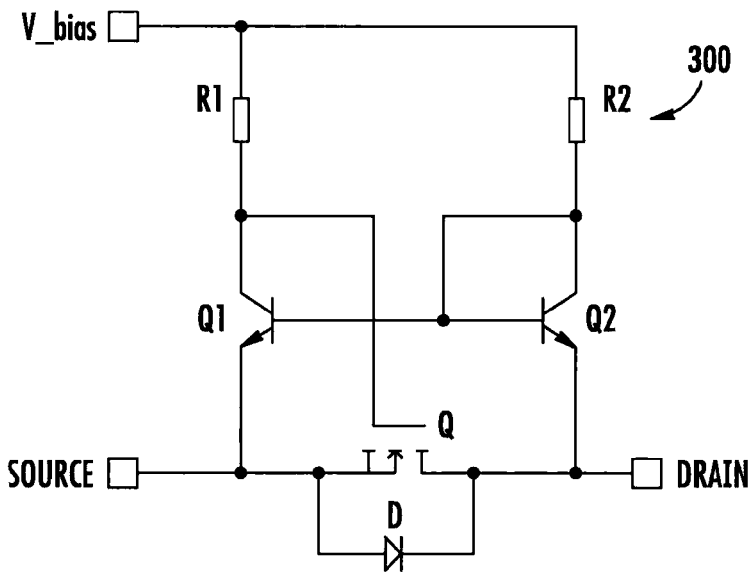
FIG. 3 illustrates a schematic view of a MOSFET controller including bipolar junction transistors with matched orientations according to the Prior Art.
Figure 4:
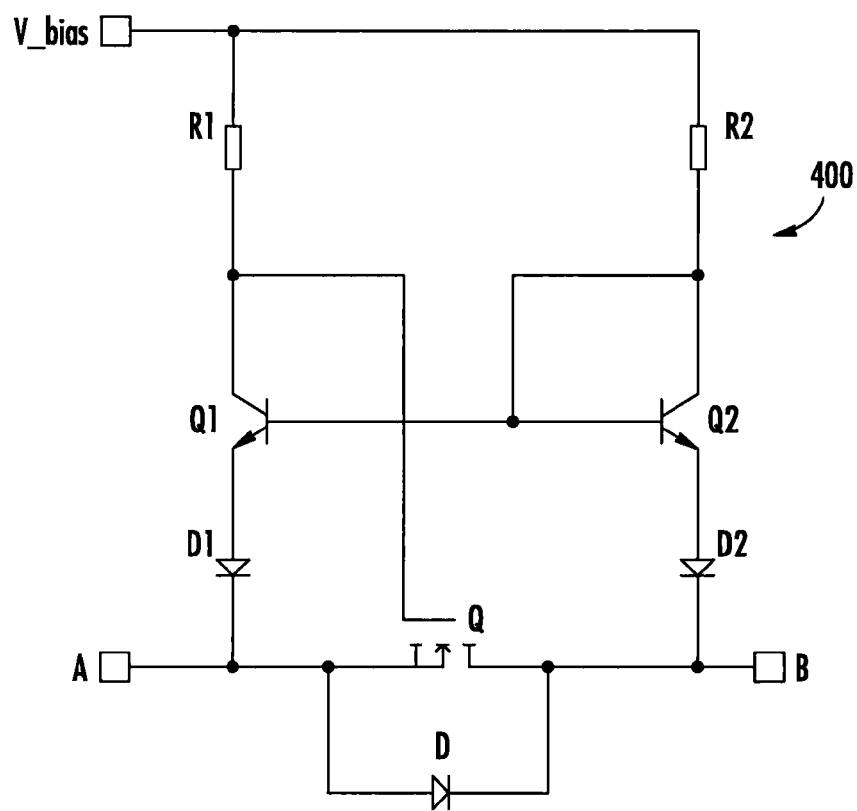
FIG. 4 illustrates a schematic view of a control circuit for controlling a switching device according to the present disclosure.

A control circuit according to one embodiment of the present disclosure is illustrated in FIG. 4 and indicated generally by reference number 400. The control circuit 400 includes a transistor Q1, a transistor Q2, a diode D1, a diode D2, and a switching device Q. The switching device Q has a control terminal, a drain terminal and a source terminal. The switching device Q includes an intrinsic diode D. The transistor Q1 is coupled to the source terminal of the switching device Q, and the transistor Q2 is coupled to the drain terminal of the switching device Q. The transistor Q1 is also coupled to the control terminal of the switching device Q. The control circuit 400 further includes resistors R1, R2 coupled to transistors Q1, Q2, respectively.

The control circuit 400 is configured to allow current flow in only one direction through the switching device Q. The configuration also permits thermal tracking of the transistors Q1, Q2 sufficient for reliable and stable emulation of an ideal diode over a temperature range including extreme temperatures. The inclusion of diodes D1, D2 further enhances reverse voltage ratings for transistors Q1, Q2. And, the control circuit of the present disclosure may provide low cost and low component count control circuits, which provide cost savings in parts and assembly.

In use, the control circuit 400 holds the switching device Q off when a voltage at node A is less than a voltage at node B. Under this condition, the intrinsic diode D of the switching device Q will be reverse biased. As shown in FIG. 4, the transistor Q2 is diode connected. With reference to a bipolar transistor having a collector terminal and a base terminal, a diode connected transistor includes the collector terminal being connected to the base terminal. The diode D2 and diode-connected transistor Q2 are reverse biased. A bias voltage is present at the bias voltage input terminal and providing bias to the transistor Q1 via resistor R2. The bias voltage holds transistor Q1 ON, which in turn, holds the switching device Q OFF. Thus, the switching device Q blocks the flow of current from node B to node A. While the switching device Q is illustrated as a FET, it should be appreciated that a different type of electrical, electromagnetic or electromechanical switching device can be employed in other embodiments (e.g. power MOSFET, JFET, bipolar transistor, BJT, IGBT, etc.). Further, the switching device Q and other transistors disclosed herein may be either n-channel or p-channel.

When the voltage at node A exceeds the voltage at node B, the intrinsic diode D of the switching device Q starts to become forward biased, allowing current to flow from node A to node B. At the same time, diode D2 and diode-connected transistor Q2 start to become forward biased. The current flow through diode D2 and transistor Q2 begins to steal current from transistor Q1. This, in turn, begins to turn the transistor Q1 OFF, which increases the voltage at the control terminal of the switching device Q. The voltage at the control terminal of the switching device Q continues to increase toward a threshold voltage of the switching device Q. At some point, the switching device Q starts to turn ON. As current flow from node A to node B increases through the switching device Q, transistor Q1 (used as a common emitter amplifier with diode D1) attempts to decrease current through transistor Q1 and diode D1. As the current through transistor Q1 decreases, the voltage drop across transistor Q1 increases. The increase voltage drop increases the voltage at the control terminal of the switching device Q linearly. At some point, on-resistance of the switching device Q becomes dominant. The voltage drop across transistor Q1 increases until the transistor Q1 is turned OFF, which holds the switching device Q ON. When the switching device Q is ON, current flows from node A to node B.

Although not denoted in FIG. 4, resistors R1, R2 have the same resistance value. It should be appreciated that the resistance values of the resistors may be different in other embodiments to adjust a switching time of the control circuit. Also, as illustrated in FIG. 4, transistors Q1, Q2 are bipolar transistors. In other embodiments, various types of transistors and equivalent switching devices may be employed as transistor Q1 and/or transistor Q2 for various reasons, such as cost and operating characteristics. Further, other diode devices or equivalents may be included as diode D1 and/or diode D2 in still other embodiments. For example, a zener diode, Schottky diode, tunnel diode, or silicon controlled rectifier may be employed.

The control circuit 400 may be used in conjunction with various types of switching devices, such as an input switching device, and output switching device, or a converter switching device. Specifically, a switching device may be included in a polarity protection FET circuit, an ORing FET circuit, or a power rectification circuit of a power supply, such as a synchronous rectifier or an active bridge rectifier. The examples listed herein are not intended to be exhaustive. Instead, it should be understood that the present disclosure can be applied to a number of different switching devices commonly used in electronics, electronic devices, electromagnetic devices and electromechanical devices.

FIG. 5 illustrates another embodiment of a control circuit 500 for controlling an ORing FET Q having a drain terminal, a source terminal, and a gate terminal. The ORing FET Q and control circuit 500 may be employed on an output of a power supply. The control circuit 500 allows current flow in only one direction through the ORing FET Q to ensure current flow from the power supply and not into the power supply. The control circuit 500 includes a transistor Q1, a transistor Q2, a diode D1, and a diode D2. The transistors Q1, Q2 are bipolar junction transistors (BJTs). Each BJT has a collector terminal, a base terminal, and an emitter terminal. The base terminal of the transistor Q1 is coupled to the base terminal of the transistor Q2. The emitter of the transistor Q1 is coupled to diode D1, which is coupled to the source terminal of the ORing FET Q. The emitter of the transistor Q2 is coupled to diode D2, which is coupled to the drain terminal of the ORing FET Q. The gate terminal of the FET Q is coupled to the collector terminal of the transistor Q1. Transistor Q2 is diode connected. The control circuit 500 also includes resistors R1, R2. Each of resistor R1, R2 has a resistance of 4.7 kΩ. It should be appreciated that one or more resistors included in other embodiments of the present disclosure may include a greater or lesser resistance.

Figure 6:
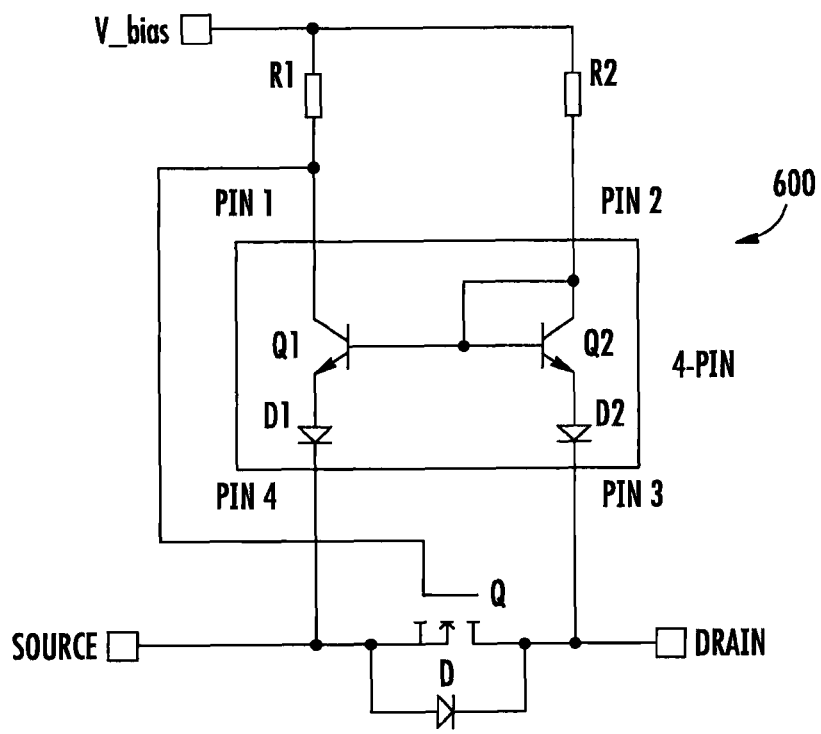
FIG. 6 illustrates a schematic view of a 4-pin integrated circuit including a control circuit.

As shown, transistors Q1, Q2 are packaged together in a BCM61 integrated circuit. The packaging of the transistors Q1, Q2 improves the thermal tracking of the transistors. The BCM61 integrated circuit is an off-the-shelf, generic component. Other known dual transistor integrated circuits may be employed in other embodiments of the present disclosure. For example, a BC847, a BC847BS, a FFB3904, a PUMX1, a BC847BD, a BCV61, a BCM846S, a ZXTD09N50 or a BCM847BS integrated circuit may be included in other embodiments and/or applications of a control circuit according to the present disclosure. As further shown in FIG. 5, diodes D1, D2 are packaged together in BAV23 integrated circuit. The packaging of the diodes D1, D2 improves the thermal tracking of the diodes. The BAV23 integrated circuit is also an off-the-shelf, generic component. Other dual diode integrated circuits, such as a BAS28, a BAV70, a BAS70-07 or a BAW101, may be employed in other embodiments of a control circuit according to the present disclosure. Further, as shown in FIG. 6, transistors Q1, Q2 and diodes D1, D2 can be employed in a 4-pin integrated circuit 600. The 4-pin integrated circuit may be an integrated circuit customized to the particular application or a generic, off-the-shelf component. Although each of these different packaging options is disclosed relative to the ORing FET application, it should be understood that the packaging options are equally applicable to the various applications for which a control circuit of the present disclosure is suited.

Referring again to FIG. 5, as referenced above, diodes D1, D2 are configured to block voltage to the transistors Q1, Q2. Diode D2 provides protection to the base-emitter junction of the transistor Q2 from a voltage output and/or a load voltage. By protecting the base-emitter junction in this manner, the control circuit 500 can be employed in an application with a voltage output up to about 205V, the control circuit's reverse voltage rating. A reverse voltage rating indicates what voltage can be present at the drain terminal of the ORing FET Q without damaging components included in the control circuit ($V_r$ of the diode D2+$V_{eb}$ of the transistor Q2). In other embodiments, a reverse voltage rating can be altered by including one or more different diodes in a control circuit. For example, a 1N4007 diode can provide a reverse voltage rating up to about 1000V. In another example, a BAW101 dual diode, integrated circuit can provide a reverse voltage rating up to about 300V.

The control circuit 500 is coupled to the source of the ORing FET Q via diode D1. In some applications of the control circuit 500, the diode D1 is included merely to provide a matching offset for diode D2. In other applications, such as a polarity protection FET, diode D1 can provide a similarly enhanced reverse voltage rating to transistor Q1 for high input voltage conditions.

Figure 7:
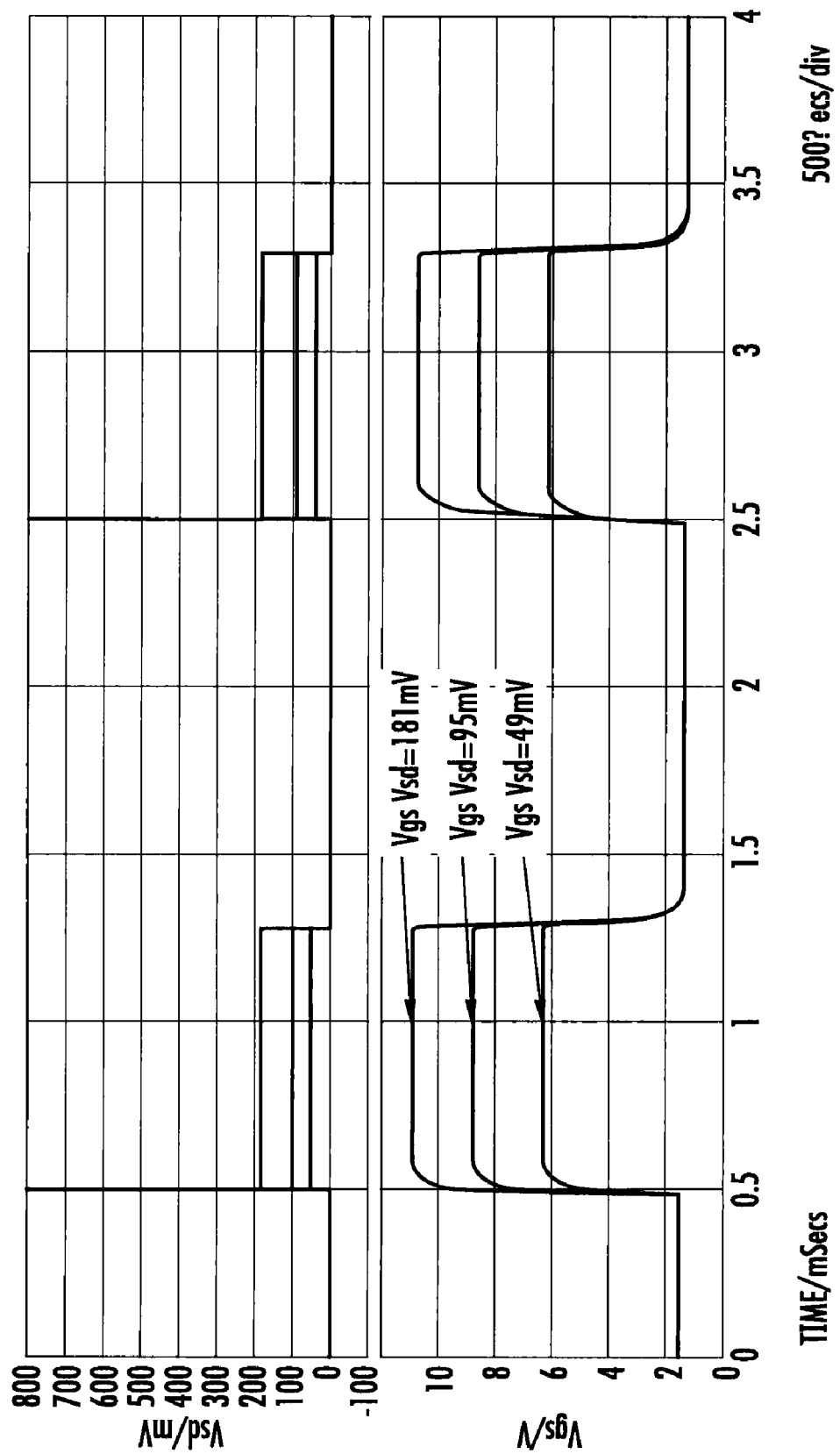
FIG. 7 illustrates a waveform of voltages simulated across terminals of the switching device of FIG. 5.

FIG. 7 illustrates waveform simulations of the control circuit 500. The waveform simulations show voltages measured at the gate of the ORing FET Q (bottom) and across the source and drain terminals of the ORing FET Q (top). The gate voltage is proportional to the source to drain voltage when Q1 is in linear mode. The higher the source to drain voltage drop, the higher the gate voltage of the ORing FET Q. The linear mode allows the ORing FET Q to respond to the output current through the ORing FET Q, rather than simply switching between an ON state and an OFF state. Additional waveform simulations are illustrated in FIGS. 8A-B. The waveform of FIG. 8A illustrates voltage at the gate of the ORing FET Q during a transition from OFF to ON at temperatures 0° C., 50° C., and 100° C. The waveform of FIG. 8B illustrates voltage at the gate of the ORing FET Q during a transition from ON to OFF at temperatures 0° C., 50° C., and 100° C. As shown, variations in the temperature have minimal effect on the control circuit 500 turning the ORing FET Q ON and OFF even at extreme temperatures.

Control circuits according to the present disclosure allow current to flow in only one direction by controlling switching of a switching device, essentially emulating an ideal diode. The operating characteristics and the simplicity of the control circuit described herein provide for a wide variety of applications of the control circuits. Across the variety of applications, operating parameters of control circuits can be adapted to the conditions of a specific application. In particular, turn ON and/or OFF switching time of a switching device coupled to a control circuit may be critical in some applications. FIG. 9 illustrates a control circuit 900 coupled to a switching device Q having a control terminal, a drain terminal and a source terminal.

The control circuit 900 includes two transistors Q1, Q2 packaged together and two diodes D1, D2 packaged together. The control circuit 900 also includes means for adjusting a switching time of the switching device Q. In this embodiment, the means for adjusting includes a totem pole circuit 902. The totem pole circuit 902 includes transistors Q4, Q5. The transistors Q4, Q5 are coupled in series between a bias voltage source and the source terminal of the switching device Q. And, the transistors Q4, Q5 are coupled to the control terminal of switching device Q. As shown in simulated waveforms included in FIG. 10, the totem pole circuit 902 provides turn ON and OFF switching times faster than the control circuit 500. Waveform 1002 illustrates the switching time without a totem pole circuit, and waveform 1004 illustrates the switching time of the control circuit 500 with totem pole circuit 902. For waveform 1002, the rise time is about 51.68 μs and the fall time is about 47.56 μs. For waveform 1004, the rise time is about 940.4 ns and the fall time is about 622.2 ns. It should be appreciated that different configuration of a control circuit may be employed in conjunction with means for adjusting the switching time of a switching device, such as a totem pole circuit. For example, as shown in FIG. 11, a control circuit 1100 is coupled to a switching device Q and includes a totem pole circuit 1102. As compared to the control circuit 900, the orientation of the transistor Q2 is changed such that the transistors Q1, Q2 are unmatched. The unmatched transistor Q1, Q2 provide for increase reverse voltage rating for the control circuit 1100.

FIGS. 12-14 disclose other means for adjusting a switching time of a switching device Q. FIG. 12 illustrates a control circuit 1200 coupled to a switching device Q having a control terminal. The control circuit 1200 includes a transistor Q5 and a diode D3. The transistor Q5 is a bipolar junction transistor (BJT) having a base terminal, a collector terminal, and an emitter terminal. The diode D3 is coupled between the base terminal and the emitter terminal of the transistor Q5. The turn ON time of the control circuit 1200 is comparable to the turn ON switching time of the control circuit 500. The control circuit 1200 provides faster turn OFF of the switching device Q relative to the control circuit 500. The turn OFF switching time of the control circuit 1200 is comparable to the turn OFF switching time of the control circuit 900.

FIG. 13 illustrates a control circuit 1300 coupled to a switching device Q having a control terminal. The control circuit includes a transistor Q5 and a resistor R3. The transistor Q5 is a BJT having a base terminal, a collector terminal and an emitter terminal. The control circuit 1300 provides faster turn ON of the switching device Q relative to the control circuit 500, but not as fast as the turn ON switching time provided by the control circuit 900. The turn ON switching can be adjusted further by changing the resistance of the resistors R3. As shown, the resistor R3 is 1 kΩ. The turn OFF switching time of the control circuit 1200 is comparable to the turn OFF switching time of the control circuit 900.

FIG. 14 illustrates control circuit 1400 coupled to a switching device Q. The control circuit 1400 includes a diode D3, a resistor R3, and a transistor Q5 having a base terminal, a collector terminal and an emitter terminal. The diode D3 is coupled between a bias voltage source and the emitter of transistor Q5. The resistor R3 is coupled between the control circuit 1400 and a voltage source 1402. In this particular embodiment, the bias voltage source tracts the ON and OFF of the switching device Q. When the switching device Q is OFF, the voltage after R3 is clamped to zero via the diode D3 and the transistor Q5. Accordingly, a current flows through the resistor R3, which may be required to be a high rated resistor. In this particular example, the resistor R3 is a 1 kΩ, 0.25 W resistor. The control circuit 1400 provides faster turn ON and OFF switching times relative to the control circuit 500. The control circuit 1400 provides turn OFF switching times comparable to the control circuit 900. In other embodiments of the control circuits illustrated in FIGS. 9 and 11-14, a resistor is connected between the means for adjusting the switching time and the control terminal of switching device Q.

While each of the control circuits disclosed in FIGS. 9 and 11-14 are illustrated as controlling an ORing FET, it should be appreciated that one or more of the disclosed control circuits can be employed in other applications, such as a synchronous rectifier. As illustrated in FIG. 15, a control circuit 1500 is coupled to a synchronous rectifier Q for controlling the synchronous rectifier Q having a control terminal, a drain terminal, and a source terminal. The control circuit 1500 includes a totem pole circuit 1502, which is consistent with totem pole circuit 1002. As explained above, the totem pole circuit 1502 is included as means for adjusting a switching time of the synchronous rectifier Q.

FIG. 16 illustrates a control circuit 1600 coupled to a synchronous rectifier Q for controlling the synchronous rectifier Q having a control terminal, a drain terminal, and a source terminal. The control circuit 1600 includes transistors Q1, Q2 and resistors R1, R2. Each of the transistors Q1, Q2 has a base terminal, a collector terminal, and an emitter terminal. Transistor Q1 is configured as a common emitter amplifier with a diode D1 to enhance the reverse voltage rating of transistor Q1. Transistor Q2 is diode connected to offset the base-emitter voltage of transistor Q1. A diode D2 is coupled to transistor Q2 to enhance the reverse voltage rating of transistor Q2 and provide matching offset for diode D1.

The control circuit 1600 also includes means for adjusting the switching time of the synchronous rectifier Q. The means for adjusting the switching time includes a totem pole circuit 1602 and a diode D3 coupled between the base terminal and the collector terminal of transistor Q1. The Schottky diode D3 adjusts the switching time of the synchronous rectifier Q by limiting the saturation of transistor Q1. When the synchronous rectifier Q is OFF, transistor Q1 is saturated (ON). For the synchronous rectifier Q to be turned ON, the transistor Q1 needs to transition from ON to OFF. When the transistor Q1 is substantially saturated, the transition of the transistor Q1 from ON to OFF occurs over a period of time. By including the Schottky diode D3, the saturation of the transistor Q1 is limited. In this embodiment, the saturation of transistor Q1 is limited to about 0.4V. Without diode D3, the saturation of the transistor Q3 is about 0.02V. Therefore, the Schottky diode D3 shortens the period of time for transitioning the transistor Q1 out of saturation and from ON to OFF. While, the diode D3 is included in addition to the totem pole circuit 1602 in control circuit 1600, it should be appreciated that diode D3 can be included with or without further means for adjusting a switching time of a switching device in other embodiments of the present disclosure. Further, while the diode D3 is illustrated as a Schottky diode (BAT54), it should be appreciated that other type of diode and packaging can be employed in other embodiments of the present disclosure. For example, diode D3 can be a different off-the-shelf component, such as a TBAT54, a BAT54CW, a BAT54C, a BAT54A, etc.

The faster switching time of the control circuit 1600, as compared to the control circuit of FIG. 15, is illustrated by comparison of FIGS. 17A-B. FIG. 17A shows the turn ON switching time of the control circuit 1600 without the Schottky diode D3. The switching time is about 564 nanoseconds. The FIG. 17B shows the turn ON switching time of the control circuit 1600 with the Schottky diode D3. The switching time is reduced to about 63 nanoseconds. Additionally, FIGS. 18A and 18B illustrate the adjustment of the switching time provided by diode D3 measured by an oscilloscope. FIG. 18A shows the switching time of the synchronous rectifier Q illustrated in FIG. 15. Channel 2 is voltage to the control terminal of the synchronous rectifier Q of FIG. 15, and channel 3 is voltage between the drain terminal and the source terminal of the synchronous rectifier Q of FIG. 15. Similarly, FIG. 18B shows the switching time of the synchronous rectifier Q illustrated in FIG. 16. Channel 2 is voltage to the control terminal of the synchronous rectifier Q of FIG. 16, and channel 3 is voltage between the drain terminal and the source terminal of the synchronous rectifier Q of FIG. 16. Channel 4 is the source current of the respective synchronous rectifier. A comparison of FIGS. 18A and 18B illustrates that the turn ON delay is substantially reduced by including the Schottky diode D3.

FIG. 19 illustrates an alternate embodiment of the control circuit 1600. As shown in FIG. 19, transistors Q1, Q2, diodes D1, D2, and Schottky diode D3 are included in a 4-pin integrated circuit 1900. The 4-pin integrated circuit 1900 provides for improved thermal tracking and printed circuit board (PCB) space savings. In other embodiments, an integrated circuit may include resistors R1, R2, a switching device Q and/or other means for adjusting a switching time of the switching device Q.

FIG. 20 illustrates a control circuit 2000 according to another embodiment of the present disclosure. The control circuit 2000 is employed in a power supply to control a synchronous rectifier Q. The control circuit includes transistors Q1, Q2 and diodes D1, D2. Each transistor Q1, Q2 is a BJT having a base terminal, a collector terminal, and an emitter terminal. The emitter terminal of transistor Q1 is coupled to diode D1, and the collector terminal of transistor Q2 is coupled to diode D2. By changing the orientation of transistor Q2, a degree of balance and symmetry is lost in the control circuit 1600. The change in the orientation of transistor Q2, however, takes advantage of the base-collector junction of transistor Q2. The unmatched orientation of transistor Q2 allows the control circuit 2000 to have a reverse voltage rating as high as about 365V. While the unmatched orientation of the transistor Q1, Q2 is disclosed relative to synchronous rectifier Q, it should be appreciated that unmatched transistors can be included in other application of a control circuit of the present disclosure to enhance the reverse voltage rating and reduce control circuit cost.

FIG. 21 illustrates a control circuit 2100 coupled to a synchronous rectifier Q for controlling the synchronous rectifier Q. The control circuit 2100 includes transistors Q1, Q2, a diode D3 and a totem pole circuit 2102. Diodes D1, D2 are absent from the prior control circuits. The control circuit 2100 is suitable for various applications in which the transistors Q1, Q2 provide sufficient reverse voltage ratings. Another embodiment of a control circuit 2200 according to the present disclosure is illustrated in FIG. 22. As shown, control circuit 2200 includes a diode D5 in place of transistor Q5 (as shown in FIG. 16). By including Schottky diode D5 with a common cathode connection with Schottky diode D3, a dual Schottky diode, common-cathode integrated circuit (e.g., BAT54C) can be used to implement the control circuit 2200.

While each of the synchronous rectifiers illustrated in FIGS. 16 and 19-22 are included in a discontinuous conduction mode (DCM) flyback power converter, it may also be included in a continuous conduction mode (CCM)+DCM flyback converter in other embodiments. In still other embodiments, a control circuit disclosed herein can be employed in a number of different types of power converters, power inverters, and power supplies. For example, a control circuit and a switching device may be included in several different types of converters, such as a flyback converter, a forward converter, a buck converter, a boost converter, a buck/boost converter, a Cuk converter, a sepic converter, a zeta converter, a push-pull converter, a half bridge converter, a full bridge, a resonant converter, a bridge rectifier, etc.

FIGS. 23A-B illustrate a power supply 2300 including two synchronous rectifiers Qa, Qb and a control circuit 2302 for controlling the synchronous rectifier Qb. FIG. 23B illustrates the power supply 2300 including a transformer T1, an inductor L, and an output capacitor C. Based on the configuration of the power supply, the synchronous rectifier Qb is a freewheeling synchronous rectifier. The control circuit 2302 is intended to couple the power supply 2300 at the designated nodes. The control circuit 2302 includes transistors Q1, Q2 included in a BCM61 package and resistors R1, R2, which have the same resistance (1.2 kΩ). The control circuit also includes diodes D1, D2. The synchronous rectifier Qb includes an intrinsic diode Db. The intrinsic diode Db may be packaging together with or separately from the synchronous rectifier Qb. As shown in FIG. 23A, the control circuit 2302 includes resistors R1, R2 and means for adjusting the switching time of the synchronous rectifier Qb. The means for adjusting switching ON time includes a Schottky diode D3 and a cascaded emitter follower driver circuit including transistors Q3, Q4, Q5 and diode D5. Although not shown, diodes D3, D5 are included in a BAT54C package. Transistors Q3, Q4 are included in a BC817 package, and transistor Q5 is included in a BC807 package. In this particular embodiment, the output of the power supply is 12.0V at 25.0 amps. While each of the packages included in the control circuit 2302 is a generic, off-the-shelf package, it should be understood that each of the particular components included in the control circuit of FIG. 23A can be packaged differently, generic or custom, in other embodiments of the present disclosure.

Figure 24A:
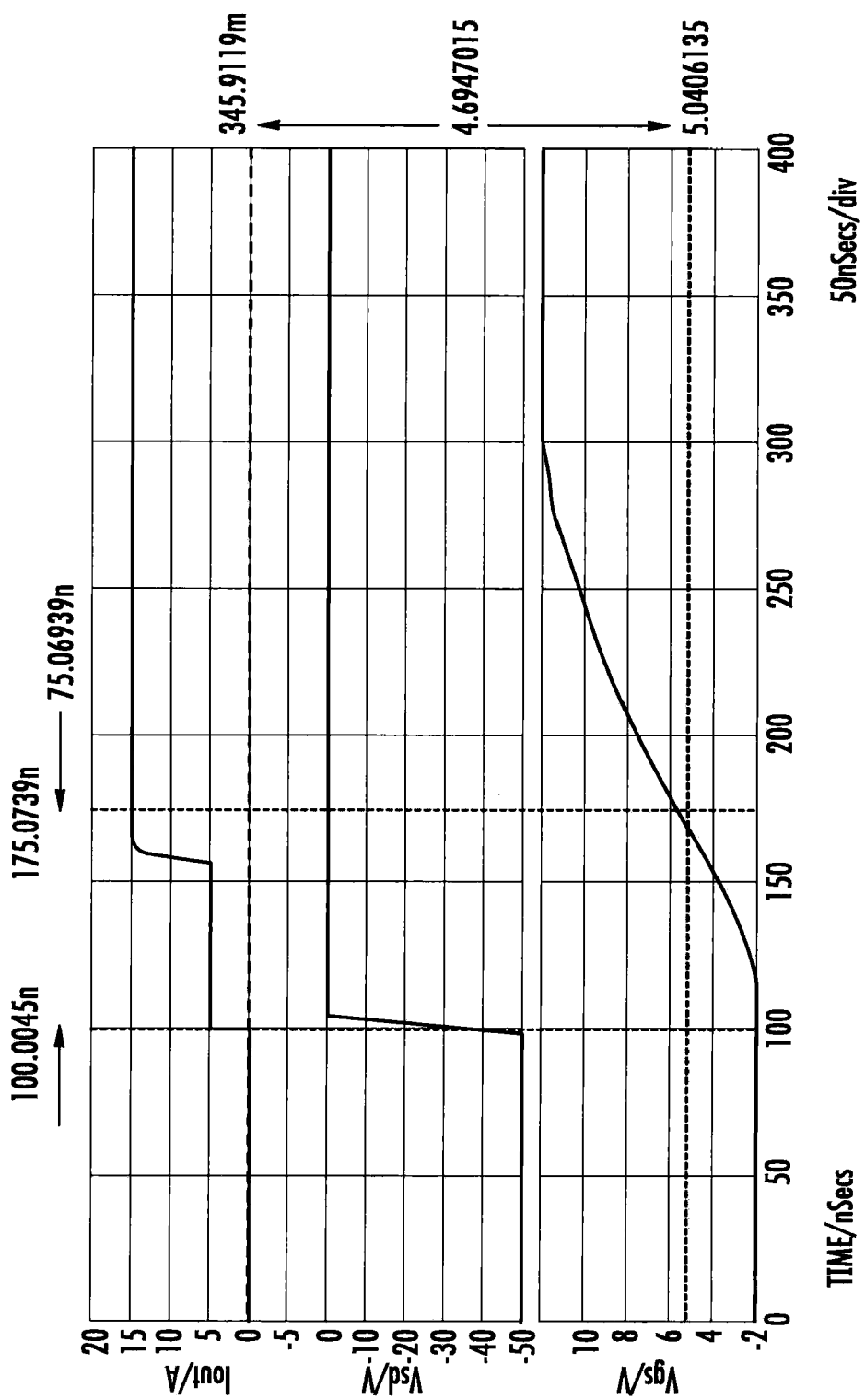
Figure 24B:
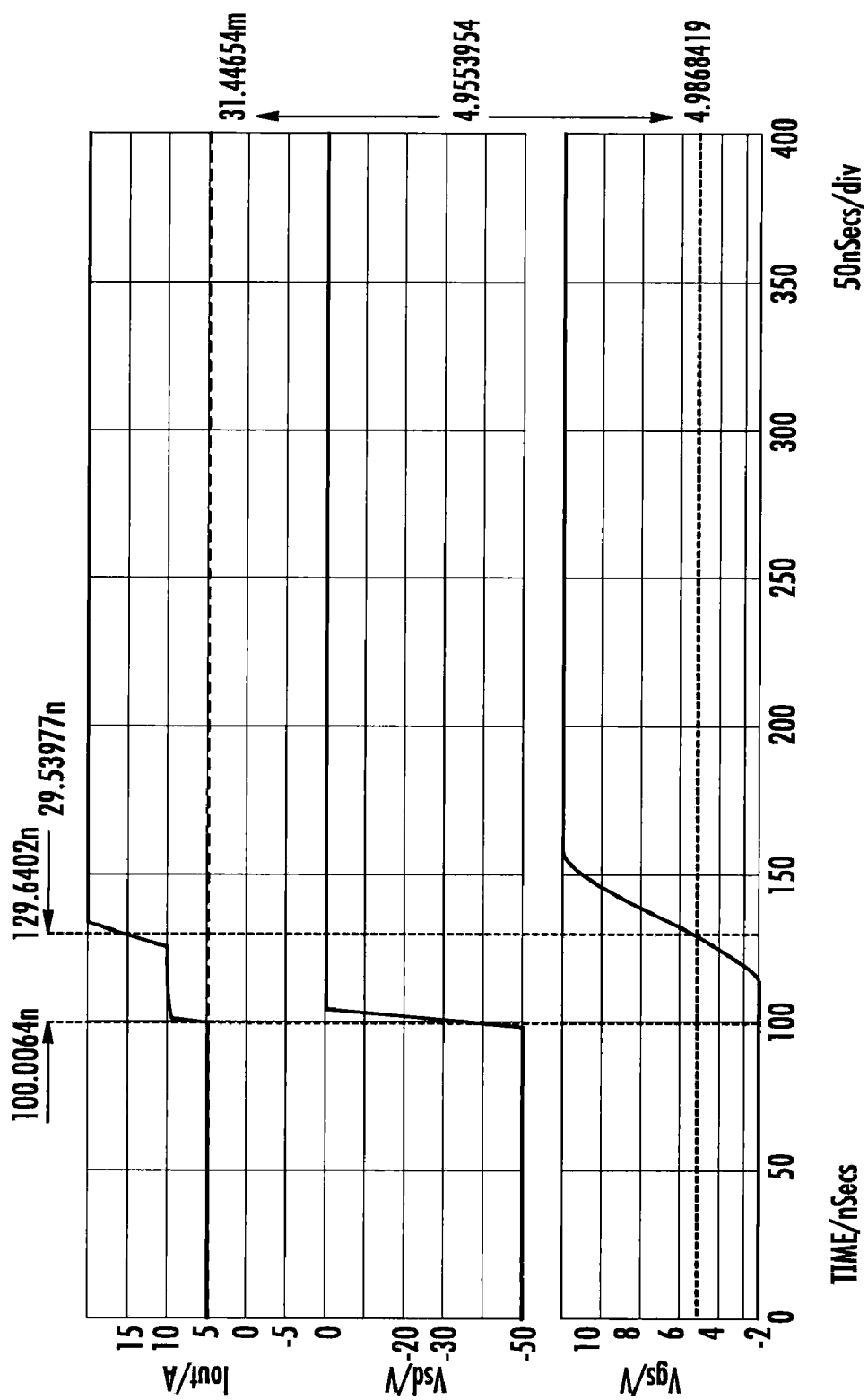

Simulated waveforms for the control circuit 2302 are illustrated in FIGS. 24A-D. FIG. 24A illustrates the turn ON switching time of the switching device Qb with only the Schottky diode D3 and the totem pole circuit including transistors Q4, Q5. The turn ON switching time of the switching device Qb is about 75 ns. FIG. 24B illustrates the turn ON switching time of the switching device Qb with the Schottky diode D3, the Darlington circuit and the totem pole circuit. The turn ON switching time of the switching device Qb is improved to about 30 ns. A turn ON switching time of about 30 ns may make the control circuit 2302 particularly suited for applications with very high switching frequencies, e.g., 400 kHz or above, which reduce conduction through an intrinsic diode included in synchronous rectifier Qb.

Referring again to FIG. 23A, the means for adjusting switching OFF time also includes an auxiliary circuit 2304. The auxiliary circuit 2304 includes a transistor Q6, resistors R3, R4, and a capacitor C1. The auxiliary circuit 2304 is controlled by a control signal of the synchronous rectifier Qa, shown as pulse wide modulated (PWM) signal. The PWM signal originates from a PWM controller coupled to the power supply 2300 (not shown). In use, an ON-time of synchronous rectifier Qa compliments an ON-time of the synchronous rectifier Qb. When synchronous rectifier Qa is turned ON, synchronous rectifier Qb is turned OFF. When synchronous rectifier Qb fails to turn OFF fast enough (i.e., both synchronous rectifiers Qa, Qb are ON), a shoot through current condition exists. The shoot through current condition can cause inefficiency and even failure of one or both of the synchronous rectifiers Qa, Qb. The auxiliary circuit 2304 reduces the occurrence of the shoot through condition. When the PWM goes high to control the synchronous rectifier Qa ON, the PWM also drives transistor Q6 ON. When transistor Q6 turns ON, the collector terminal of transistor Q1 is clamped to V_TRN, which turns the transistor Q3 OFF, which causes the synchronous rectifier Qb to turn OFF.

Figure 24C:
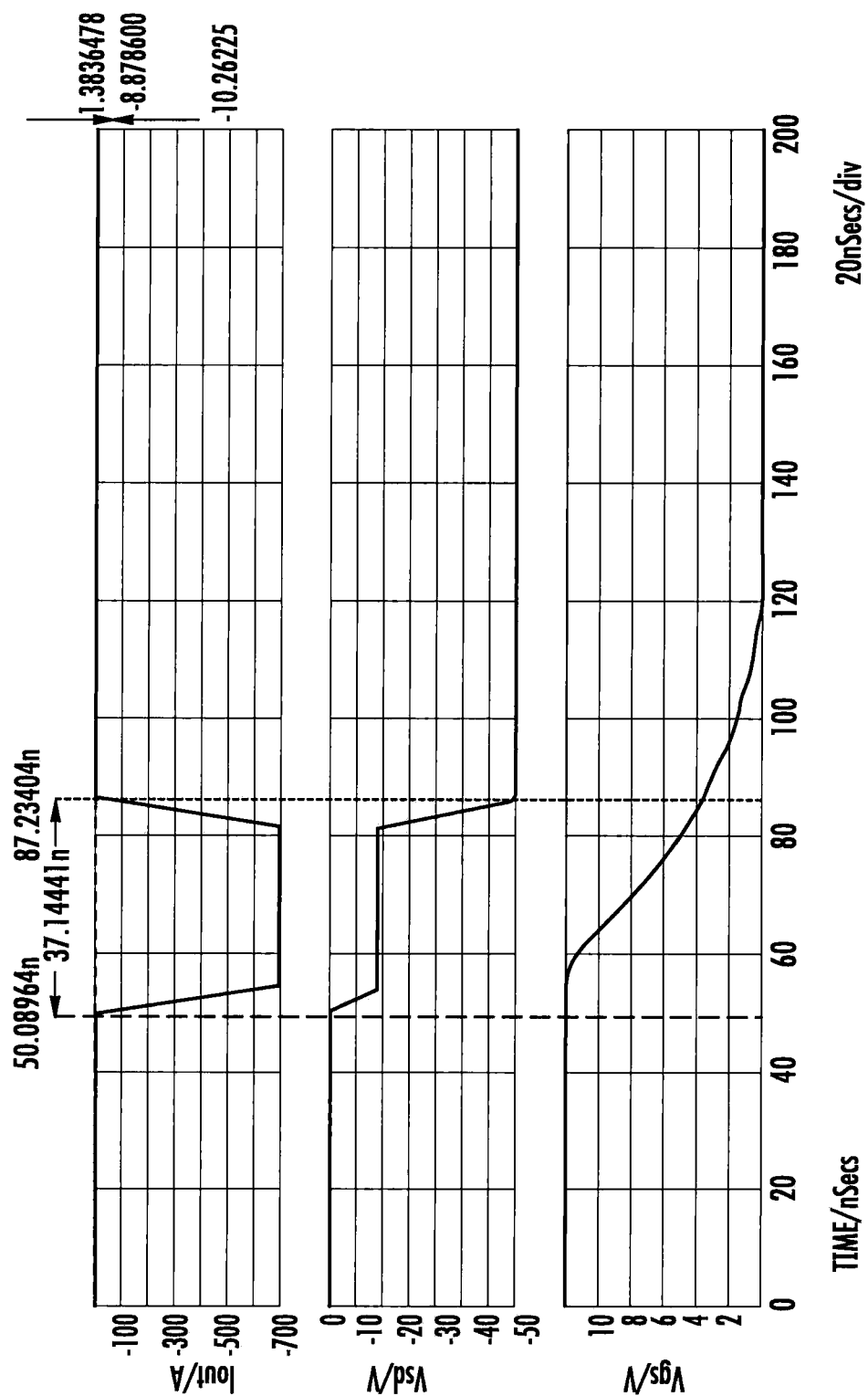
Figure 24D:
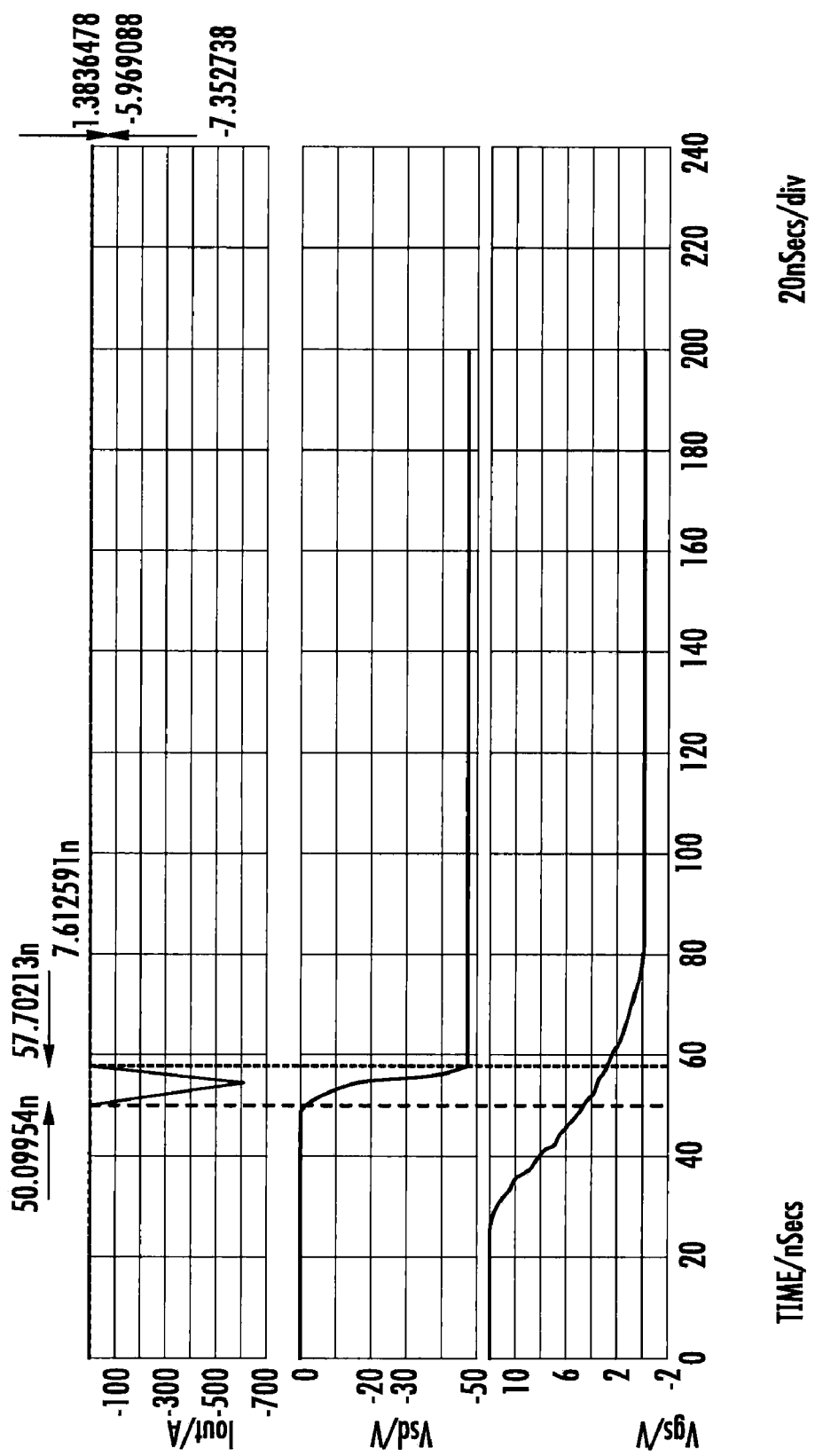

The auxiliary circuit 2304 adjusts turn OFF switching time of the synchronous rectifier Qb. The exemplary implementation of the auxiliary circuit 2304 includes resistor R3 being 100Ω, the capacitor C1 being 100 pF, and the transistor Q6 being 2N7002. The synchronous rectifier Qb is a FDP060AN08A0 device. The turn OFF switching time is illustrated in simulated waveforms of FIGS. 24C-D. FIG. 24C illustrates the turn OFF switching time of the switching device Qb without the auxiliary circuit 2304. The turn OFF switching time of the switching device Qb is about 37.1 ns. FIG. 24D illustrates the turn OFF switching time of the switching device Qb with the auxiliary circuit 2304. The turn OFF switching time of the switching device Qb is improved to about 7.6 ns. The turn OFF switching time can be programmed and/or optimized by varying the values of resistors R3, R4 and capacitor C1 in the auxiliary circuit 2304. The turn OFF switching time of the switching device Qb can also be programmed on-time propagation delay of the included PWM controller. While resistors R3, R4 and capacitor C1 are included to adjust a switching time, it should be appreciated that one or more of resistors R3, R4 and capacitor C1 may be included or excluded in other embodiments depending on the particular application of the embodiment, a voltage level of a PWM signal and timing of a PWM signal. For example, in at least one embodiment, a PWM signal may be connected directly to a gate terminal of a transistor Q6.

The power supply disclosed above in FIG. 23B may be included in an AC/DC power supply application. The AC input to the power supply can range from about 90-264 volts (AC) at about 47-63 Hz with an output of about 12.0 volts at about 20.0 amps, about 5.0 volts at about 35.0 amps, about 3.3 volts at about 15.0 amps, and about 5.0 volts stand-by at about 2.0 amps. Switching frequency of the two synchronous rectifiers included in the forward converter is about 125 kHz. As understood by the particular outputs of the power supply, one implementation of the power supply described above is in a personal computer, such as a laptop. It should be understood that the control circuit can be employed in a number of different power supplies and power supply sub-assemblies to provide polarity protection, voltage conditioning and/or voltage output.

Figure 26A:
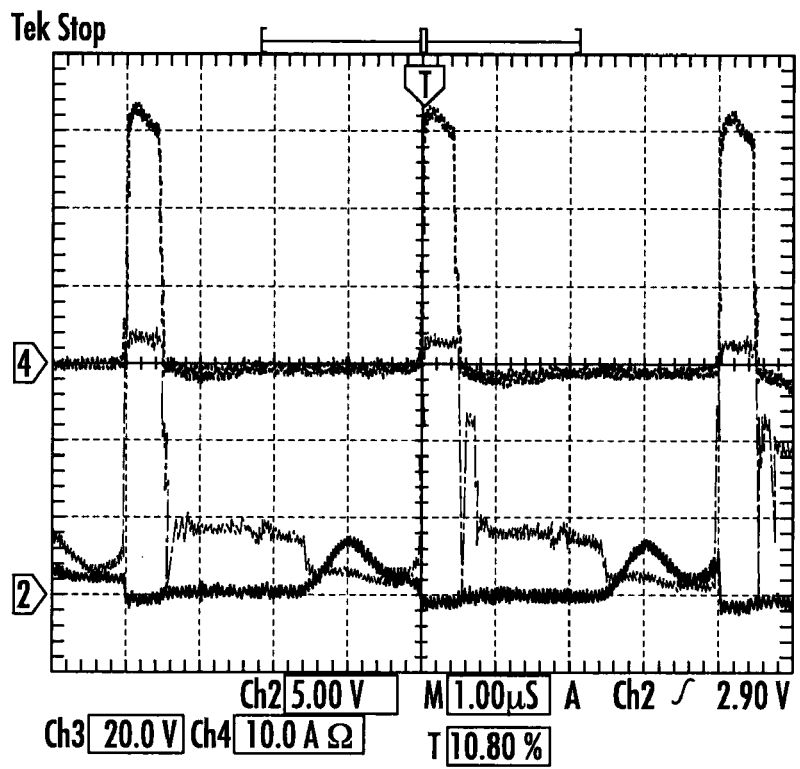
Figure 26B:
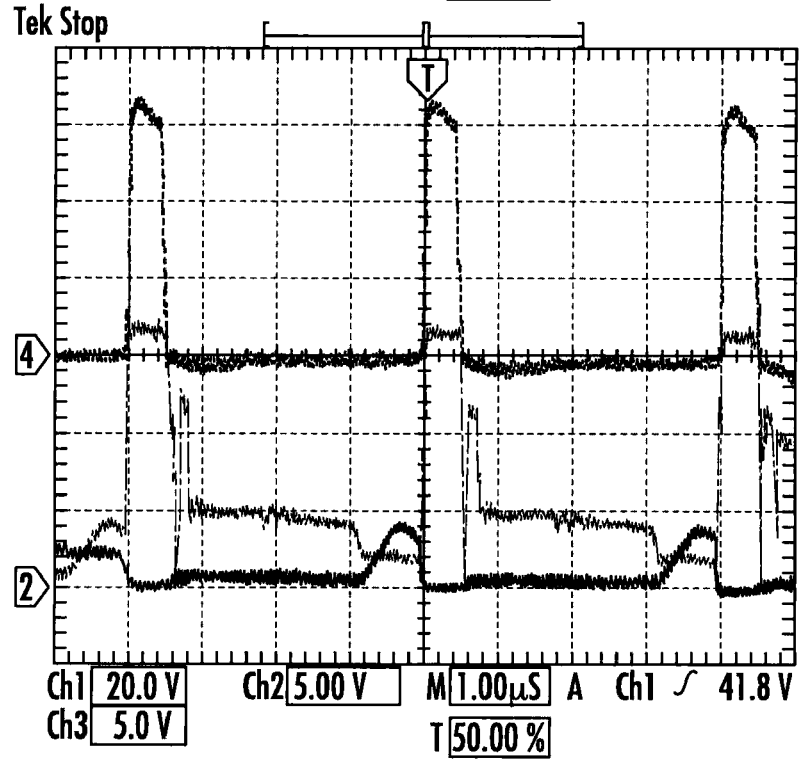
Figure 26C:
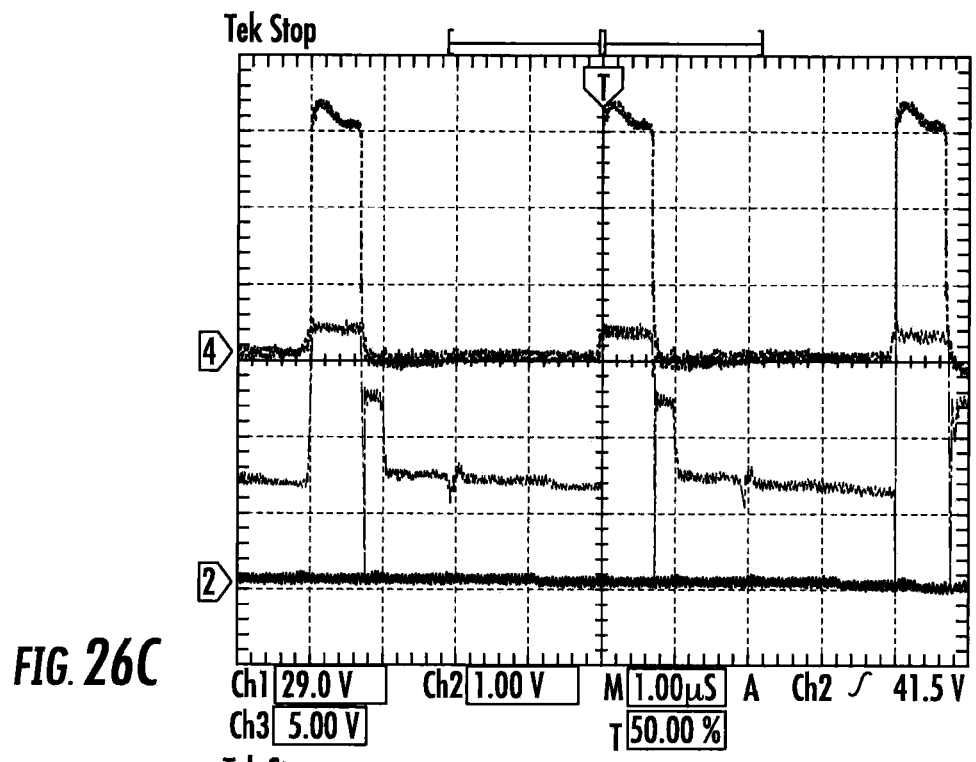
Figure 26D:
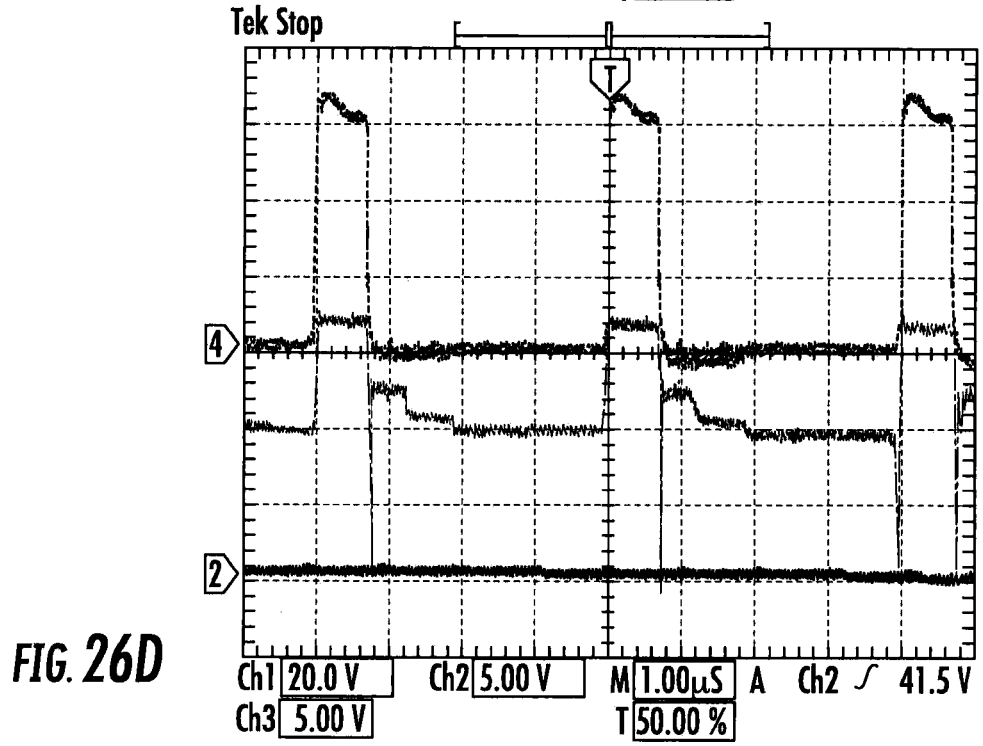

FIGS. 25A-B further illustrate actual measured waveforms for the drain-source voltage of the synchronous rectifier Qb at channel 1 and the gate voltage of the synchronous rectifier Qb at channel 2. A waveform associated at channel 3 is the PWM signal provided to the transistor Q6. As shown, the turn ON switching time of the synchronous rectifier Qb is about 44 ns. The leading turn OFF switching time of the synchronous rectifier Qb is about 102 ns, which is programmable and dependent on the auxiliary circuit, specifically the values of the resistors R3 and capacitor C1. FIGS. 26A-D further illustrate waveforms of the switching times of the synchronous rectifier Qb as controlled by the control circuit 2302. The various waveforms show the switching times of the synchronous rectifier Qb under various loading conditions. FIG. 26A illustrates the switching times of the synchronous rectifier Qb for about 5.0 volts at about 0.5 amps. FIG. 26B illustrates the switching times of the synchronous rectifier Qb for about 5.0 volts at about 1.0 amp. FIG. 26C illustrates the switching times of the synchronous rectifier Qb for about 5.0 volts at about 10.0 amps. FIG. 26D illustrates the switching times of the synchronous rectifier Qb for about 5.0 volts at about 25.0 amps. Spikes in the gate voltage of the synchronous rectifier Qb are visible in the lower current waveforms due to current through the intrinsic diode Db of the synchronous rectifier Qb and then the ON resistance is dominant.

As explained above, the packaging of the various components of a control circuit can provide increased cost saving, reduced PCB space, and improved thermal tracking. FIG. 27A illustrates a 3-pin integrated circuit 2700 including a control circuit and a synchronous rectifier Q. FIG. 27B illustrates a power supply 2702 application for the 3-pin integrated circuit 2700. The 3-pin integrated circuit can be distributed as a smart diode. It should be appreciated that an integrated circuit can include more or less components to provide increased or decreased flexibility in a particular embodiment. For example, a totem pole, a Schottky diode, a Darlington circuit, a Baker clamp circuit, or an auxiliary circuit can be excluded from the integrated circuit to increase user control of the various components of these means for adjusting the switching time of the synchronous rectifier Q. For example, FIG. 28 illustrates an exemplary embodiment including a 4-pin integrated circuit 2800, which incorporates a Schottky diode D3, a Darlington circuit, a totem pole circuit, and an auxiliary circuit. The Schottky diode D3, Darlington circuit, totem pole circuit, and auxiliary circuit are each included to adjust a switching time of switching device Q. In other embodiments, a synchronous rectifier Q can be excluded from an integrated circuit to provide a user with a choice regarding which switching device to employ.

FIGS. 29A-B illustrate yet another embodiment of the present disclosure. FIG. 29A shows an integrated circuit 2900 including switching devices Qa, Qb and control circuits 2902, 2904. Each of the switching devices Qa, Qb includes a gate terminal, a drain terminal, and a source terminal. Control circuit 2902 control switching device Qa, and control circuit 2904 control switching device Qb. Each control circuit includes a Darlington circuit, a totem pole circuit, and a Schottky diode D3. In this particular embodiment, the source of the switching device Qa and the source of the switching device Qb are coupled to a common anode pin of the integrated circuit. The integrated circuit 2900 includes a cathode_A pin and a cathode_B pin, resulting in a dual cathode integrated circuit. Thus, the integrated circuit 2900 provided efficient connection to a forward converter power supply 2906. It should be appreciated that a different number of switching devices and associated control circuits can be included in other embodiments of the present disclosure. It should also be appreciated that the particular coupling of a switching device and/or a control circuit to one or more pins of an integrated circuit can be altered, depending on a particular application of an embodiment. FIG. 30 illustrate a push-pull converter 3000. The push-pull converter 3000 illustrates another embodiment in which the dual cathode integrated circuit 2900 may be employed.

FIGS. 31A-B illustrate a power supply 3100 and control circuit 3102. The power supply includes switching devices Qa, Qb. The control circuit 3102 includes a dual totem pole circuit 3104 (transistors Q3, Q7 being a first stage totem pole circuit, and transistors, Q4 Q5 being a second stage totem pole circuit), an auxiliary circuit 3106, and a diode D3 for adjusting a switching time of the switching device Qb. It should be appreciated that a different combination of the means for adjusting a switching time of a switching device can be included in other embodiments of the present disclosure. For example, FIGS. 32-36 illustrate several addition embodiments of a control circuit for power supply 2300. Each embodiment includes one or more means for adjusting a switching time of the switching device Qb of power supply 2300. FIG. 32 illustrates a control circuit 3200 with an auxiliary circuit 3202 and a Darlington circuit 3204. Diode D5 is connected to an emitter of transistor Q4. Diodes D3, D5 can be included in a dual diode, common cathode integrated circuit. FIG. 33 illustrates a control circuit 3300 including an auxiliary circuit 3302. The auxiliary circuit 3302 includes transistor Q6 having a control terminal, a capacitor C1, and resistors R3, R4. Resistor R3 and capacitor C1 are coupled in series to a control terminal of a bipolar transistor Q6. The auxiliary circuit 3302 clamps a voltage of an emitter terminal of transistor Q1 to nearly zero quickly due to the differential circuit of C1 and R3.

FIG. 34 illustrates a control circuit 3400, which includes two transistors Q1, Q2. Each of the transistors Q1, Q2 is a bipolar junction transistor having a base terminal, a collector terminal, and an emitter terminal. The transistor Q1 is coupled to a diode D1 via the emitter terminal, and the transistor Q2 is coupled to a diode D2 via the collector terminal. The change in orientation, as compared to FIG. 23A, allows the base-collector junction of transistor Q2 to be utilized. The unmatched orientation of Q2 allows the control circuit 3400 to have a reverse voltage rating as high as about 365V.

FIG. 35 illustrate a control circuit 3500, which includes transistors Q1, Q2, a totem pole circuit 3502, a Darlington circuit, a Baker clamp circuit, an auxiliary circuit 3504, resistors R1, R2, and diodes D1, D2, D3, D4, D5. Each of the transistors Q1, Q2 is a bipolar junction transistor having a base terminal, a collector terminal, and an emitter terminal. The base terminals of the transistors Q1, Q2 are coupled to one another and to the collector terminal of transistor Q2. A diode D4 is coupled between the collector terminal of transistor Q2 and resistor R2. Diode D3 is coupled between the collector of transistor Q1 and the diode D4, creating collector-base junction of transistor Q1 coupled in parallel with diodes D3, D4. Diode D5 is coupled between the collector of transistor Q1 and the totem pole circuit 3502. Selecting the proper diode D3, D4 can provide adjustment of the saturation limit of the transistor Q1 and, in turn, adjustment of the switching time of the synchronous rectifier Qb. Table 1 below shows different permutations of diode and Schottky diode for use as diodes D3, D4.

TABLE 1

| D3 | Diode | Diode | SBD | SBD | SBD |
|---|---|---|---|---|---|
| D4 | SBD | Diode | SBD | Diode | Short Circuit |
| Vb vs. Vc | Vb = Vc + 0.4 | Vb = Vc | Vb = Vc | Vb = Vc − 0.4 | Vb = Vc + 0.3 |

As shown, each different combination of fast recovery diodes and/or Schottky diodes changes the saturation limit of the transistor Q1. Despite the inclusion of only fast recovery diodes and Schottky diodes in Table 1, it should be understood that a different type of diode can be employed in other embodiments of a control circuit.

FIG. 36 illustrates a control circuit 3600, which includes a Darlington circuit 3602 and an auxiliary circuit 3604. As shown, the Darlington circuit 3602 includes fewer components than some of the control circuits described above. The control circuit 3600 provides a similar turn ON switching time for the synchronous rectifier Qb to FIGS. 23A, 31A, and 32-35. By including of the auxiliary circuit 3604, the control circuit 3600 retains the programmable turn OFF switching time of the synchronous rectifier Qb. The switching device Qb, however, can not be turned off automatically if the PWM signal is disabled, because the turn OFF relies directly on transistor Q6 based on the omission of transistor Q5 as compared to FIG. 23A.

According to another embodiment of the present disclosure, a full-bridge rectifier 3700 includes four switching devices Qa, Qb, Qc, Qd and four control circuits 3702, 3704, 3706, 3708. Each of the switching devices is a RFP4332PBF. Each of the control circuits is coupled to a respective one of the switching devices. Control circuit 3704 is representative of control circuits 3702, 3706, 3708. Each control circuit includes transistors Q1, Q2 (ZXTD09N50DE6), diodes D1, D2 (DB1N4007). Each control circuit also includes resistors R1, R2, which each have a resistance of 10 kΩ. It should be appreciated that different type of diodes, transistors, resistor and switching devices can be employed in other embodiments of the present disclosure. The control circuit is configured to allow current flow in only one direction through the switching device Qb.

FIG. 38A illustrates waveform simulations of the full-bridge rectifier 3700 for an input voltage of 180 VAC at 50 Hz with a load resistor of 10Ω. Waveforms 3802 illustrate voltages at control terminals of switching devices Qb, Qc. Waveforms 3804 illustrate voltages at control terminals of switching devices Qa, Qd. Waveforms 3806 illustrate the source current through Qa, Qb, and waveform 3808 illustrates the output voltage, of the full bridge rectifier 3700. FIG. 38B illustrates an expanded view of a time interval of FIG. 38A. FIGS. 39A-B illustrate a measured waveform from the full bridge rectifier 3700. The output from the full bridge rectifier 3700 may be up to about 3600 W. It should be appreciated that one or more of the components may be configured and/or changed to alter an output voltage or current of a rectifier in a different embodiment.

As shown, control circuit 3704 includes a bias voltage Vb_bias. A bias voltage is included in each of the control circuits 3702, 3706, 3708. The bias voltages for the control circuits 3702, 3704, 3706, 3708 can be rectified from the AC input or using the bias voltage in the power supply directly. A bias voltage PVCC, which is a bias voltage supplied from a primary side within the power supply, may be used for control circuits 3702, 3704. The bias voltage for control circuits 3706, 3708 can use other bias voltage rectified from an auxiliary winding of a power factor correction choke or divided by the bulk voltage. In other embodiments, one or more different combinations of bias voltages may be applied to control circuits 3702, 3704, 3706, 3708.

It should be appreciated that the control circuits included in the full bridge rectifier 3700 can employ one or more means for adjusting the switching time of a switching device. For example, as shown in FIG. 40, a totem pole circuit 4000 is included in a control circuit 4002 of a full bridge rectifier 4004 to adjust the switching time of switching device Qb. In other embodiments, different combinations of the embodiments described above can be included in one or more of the control circuits included in a full-bridge rectifier. For example, as shown in FIG. 41, the orientation of transistor Qb2 can be altered to affect the reverse voltage rating of control circuit 4100. In another example, as shown in FIG. 42, the orientation of the transistor Qb2 can be altered in conjunction with a totem pole circuit included in a control circuit 4200. In still other embodiments according to the present disclosure, different contents and/or types of packaging may be employed. As shown in FIG. 43, an integrated circuit 4300 can include four switching devices and associated control circuits. The single integrated circuit includes six external pins for connecting to AC+, AC−, DC+, DC− and two bias voltages. The bias voltage can be provided from an AC input or from the power supply directly, as explained above.

FIGS. 44A-B illustrates a power supply 4400 and integrated circuit 4402 according to another embodiment of the present disclosure. The power supply 4400 includes a transformer T1, an inductor L1, and a capacitor C1. The integrated circuit 4402 includes a full-bride rectifier with four switching devices Qa, Qb, Qc, Qd. Each of the switching devices is connected with one of four control circuits included in the integrated circuit 4402. Each of the control circuits includes means for adjusting a switching time of the switching device connected thereto. It should be appreciated that, in other embodiments, each of the switching devices and control circuits can be employed in separate packaging. For example, a rectifier can include four control circuits 4500 as shown in FIG. 45 in combination with four FETs, packages separately. A number of different packaging options, generic and custom, are available for particular applications of one or more control circuits and switching devices included in power supplied according to the present disclosure.

While several aspects of the present disclosure have been described with specific reference to an ORing FET, a polarity protection FET, a synchronous rectifier, and/or an active bridge rectifier, it should be understood that each aspect of the present disclosure may be adapted to any one of the applications and/or embodiments described herein.

FIG. 46 illustrates a multi-stage power supply 4600 coupled to a load 4602 according to another embodiment. The power supply includes a first stage and a second stage. The first stage includes a polarity protection switching device 4604 coupled to a control circuit 4606, a power converter 4608 with at least one switching device and a control circuit 4610, and a ORing FET 4612 coupled to a control circuit 4614. The second stage is substantially the same as the first stage. It should be appreciated that a different number of stages may be included in a power supply of another embodiment. It should further be appreciated that a different number of switching devices may be coupled to a control circuit according to the present disclosure. Further, the power converter included in each illustrated stage can be any number of DC/DC or AC/DC topologies know to include at least one switching device.

Although several aspects of the present disclosure have been described above with reference to power supplies, it should be understood that various aspects of the present disclosure are not limited to power supplies, and can be applied to a variety of other switching devices and applications.

By implementing any or all of the teachings described above, a number of benefits and advantages can be attained including improved system reliability, reduced system down time, elimination or reduction of redundant components or systems, avoiding unnecessary or premature replacement of components or systems, and a reduction in overall system and operating costs.

What is claimed:

1. A control circuit for controlling a field effect transistor (FET) having a source terminal, a drain terminal, and a gate terminal, the control circuit comprising a first node for coupling to the source terminal of the FET, a second node for coupling to the drain terminal of the FET, a third node for coupling to the gate terminal of the FET, a first transistor coupled to the third node, a second transistor, a first diode coupled between the first transistor and the first node, and a second diode coupled between the second transistor and the second node, the first diode directly coupled to the first node, the second diode directly coupled to the second node, the control circuit configured to allow current flow in only one direction between the source and drain terminals of the FET when the first node is connected to the source terminal, the second node is connected to the drain terminal, and the third node is connected to the gate terminal.

2. The control circuit of claim 1 wherein the control circuit is configured to operate the FET substantially exclusively in its linear mode to allow current flow in the only one direction between the source terminal and the drain terminal when the first node is connected to the source terminal, the second node is connected to the drain terminal, and the third node is connected to the gate terminal.

3. The control circuit of claim 1 wherein the second transistor is a diode-connected transistor.

4. The control circuit of claim 1 wherein the first transistor and the first diode are configured to operate as an amplifier for controlling a voltage at the gate terminal of the FET when the first node is connected to the source terminal, the second node is connected to the drain terminal, and the third node is connected to the gate terminal.

5. The control circuit of claim 3 further comprising a bias voltage input terminal, a first resistor coupled between the bias voltage input terminal and the first transistor, and a second resistor coupled between the bias voltage input terminal and the second transistor.

6. The control circuit of claim 5 wherein the first resistor and the second resistor have substantially the same resistance.

7. The control circuit of claim 3 wherein the first transistor has a first terminal, a second terminal and a control terminal, the control circuit further comprising a third diode connected between the first terminal and the control terminal of the first transistor.

8. The control circuit of claim 7 wherein the third diode is a Schottky diode.

9. The control circuit of claim 3 further comprising means for adjusting a switching time of the FET when the first node is connected to the source terminal, the second node is connected to the drain terminal, and the third node is connected to the gate terminal.

10. The control circuit of claim 9 wherein the means for adjusting includes means for adjusting an ON time of the FET.

11. The control circuit of claim 9 wherein the means for adjusting includes means for adjusting an OFF time of the FET.

12. The control circuit of claim 1 wherein the first transistor, the second transistor, the first diode, and the second diode are packaged together in an integrated circuit.

13. The control circuit of claim 3 wherein the first transistor and the second transistor are packaged together in an integrated circuit.

14. The control circuit of claim 3 wherein the first diode and the second diode are packaged together in an integrated circuit.

15. The control circuit of claim 3 wherein the first transistor and the second transistor each have a first terminal, a second terminal and a control terminal, the control terminal of the second transistor connected to the control terminal of the first transistor.

16. A power supply comprising at least one ORing FET and the control circuit of claim 1 for controlling the ORing FET.

17. A power supply comprising at least one polarity protection FET and the control circuit of claim 1 for controlling the polarity protection FET.

18. A power supply comprising at least one synchronous rectifier and the control circuit of claim 1 for controlling said synchronous rectifier.

19. A power supply comprising a bridge rectifier having at least one FET and the control circuit of claim 1 for controlling the at least one FET.

20. The power supply of claim 19 wherein the bridge rectifier is a full-bridge rectifier.

21. The power supply of claim 19 wherein the control circuit includes means for adjusting a switching time of the at least one FET.

22. A method of controlling a field effect transistor (FET) having a source terminal, a drain terminal and a gate terminal, the method comprising operating the FET substantially exclusively in its linear mode to allow current flow in only one direction between the source terminal and the drain terminal.

23. The control circuit of claim 1 wherein the first transistor and the second transistor are bipolar junction transistors each having a base terminal, an emitter terminal, and a collector terminal, the first diode and the second diode each include an anode and a cathode, the emitter terminal of the first transistor is coupled to the anode of the first diode, the emitter terminal of the second transistor is coupled to the anode of the second diode, the cathode of the first diode is coupled to the first node, and the cathode of the second diode is coupled to the second node.

24. The power supply of claim 16 wherein the ORing FET includes a source terminal, a drain terminal and a gate terminal, the first node of the control circuit is coupled to the source terminal of the ORing FET, the second node of the control circuit is coupled to the drain terminal of the ORing FET, the third node of the control circuit is coupled to the gate terminal of the ORing FET, the first transistor and the second transistor are bipolar junction transistors each having a base terminal, an emitter terminal, and a collector terminal, the first diode and the second diode each include an anode and a cathode, the emitter terminal of the first transistor is coupled to the anode of the first diode, the emitter terminal of the second transistor is coupled to the anode of the second diode, the cathode of the first diode is coupled to the first node, and the cathode of the second diode is coupled to the second node.

25. The power supply of claim 17 wherein the polarity protection FET includes a first source terminal, a drain terminal and a gate terminal, the first node of the control circuit is coupled to the source terminal of the polarity protection FET, the second node of the control circuit is coupled to the drain terminal of the polarity protection FET, the third node of the control circuit is coupled to the gate terminal of the polarity protection FET, the first transistor and the second transistor are bipolar junction transistors each having a base terminal, an emitter terminal, and a collector terminal, the first diode and the second diode each include an anode and a cathode, the emitter terminal of the first transistor is coupled to the anode of the first diode, the emitter terminal of the second transistor is coupled to the anode of the second diode, the cathode of the first diode is coupled to the first node, and the cathode of the second diode is coupled to the second node.

26. The power supply of claim 18 wherein the synchronous rectifier includes a FET having a source terminal, a drain terminal and a gate terminal, the first node of the control circuit is coupled to the source terminal of the FET, the second node of the control circuit is coupled to the drain terminal of the FET, the third node of the control circuit is coupled to the gate terminal of the FET, the first transistor and the second transistor are bipolar junction transistors each having a base terminal, an emitter terminal, and a collector terminal, the first diode and the second diode each include an anode and a cathode, the emitter terminal of the first transistor is coupled to the anode of the first diode, the emitter terminal of the second transistor is coupled to the anode of the second diode, the cathode of the first diode is coupled to the first node, and the cathode of the second diode is coupled to the second node.

27. The power supply of claim 19 wherein the at least one FET includes a source terminal, a drain terminal and a gate terminal, the first node of the control circuit is coupled to the source terminal of the FET, the second node of the control circuit is coupled to the drain terminal of the FET, the third node of the control circuit is coupled to the gate terminal of the FET, the first transistor and the second transistor are bipolar junction transistors each having a base terminal, an emitter terminal, and a collector terminal, the first diode and the second diode each include an anode and a cathode, the emitter terminal of the first transistor is coupled to the anode of the first diode, the emitter terminal of the second transistor is coupled to the anode of the second diode, the cathode of the first diode is coupled to the first node, and the cathode of the second diode is coupled to the second node.

28. The method of claim 22 wherein the switching device FET is a synchronous rectifier in a power converter.

29. The method of claim 22 wherein the FET is an ORing FET.

30. The method of claim 22 wherein the FET is a polarity protection FET coupled to the input of a power converter.

* * * * *

UNITED STATES PATENT AND TRADEMARK OFFICE
CERTIFICATE OF CORRECTION

PATENT NO. : 8,207,779 B2 Page 1 of 1
APPLICATION NO. : 12/121988
DATED : June 26, 2012
INVENTOR(S) : Hu et al.

It is certified that error appears in the above-identified patent and that said Letters Patent is hereby corrected as shown below:

Col. 17, line 30, in claim 25, delete "first"

Col. 18, line 35, in claim 28, delete "switching device"

Signed and Sealed this
Eighteenth Day of September, 2012

David J. Kappos
*Director of the United States Patent and Trademark Office*